United States Patent [19]
Holonyak, Jr. et al.

[11] Patent Number: 5,373,522
[45] Date of Patent: Dec. 13, 1994

[54] SEMICONDUCTOR DEVICES WITH NATIVE ALUMINUM OXIDE REGIONS

[75] Inventors: Nick Holonyak, Jr., Urbana; John M. Dallesasse, Wheaton, both of Ill.

[73] Assignee: The Board Of Trustees Of The University Of Illinois, Urbana, Ill.

[21] Appl. No.: 117,422

[22] Filed: Sep. 7, 1993

Related U.S. Application Data

[60] Division of Ser. No. 721,843, Jun. 24, 1991, Pat. No. 5,262,360, which is a continuation-in-part of Ser. No. 636,313, Dec. 31, 1990, abandoned.

[51] Int. Cl.⁵ .............................................. H01S 3/19
[52] U.S. Cl. ...................................... 372/45; 372/46; 372/43; 372/49
[58] Field of Search .................. 512/45, 43, 46, 49

[56] References Cited

U.S. PATENT DOCUMENTS

| | | | |
|---|---|---|---|
| 3,859,178 | 1/1975 | Logan et al. | 204/15 |
| 3,890,169 | 6/1975 | Schwartz et al. | 148/147 |
| 3,914,465 | 10/1975 | Dyment et al. | 427/82 |
| 3,969,164 | 7/1976 | Cho et al. | 148/175 |
| 4,116,722 | 9/1978 | Kamei et al. | 148/1.5 |
| 4,144,634 | 3/1979 | Chang et al. | 29/571 |
| 4,172,906 | 10/1979 | Pancholy | 427/82 |
| 4,176,206 | 11/1979 | Inoue | 427/82 |
| 4,216,036 | 8/1980 | Tsang | 148/175 |
| 4,291,327 | 9/1981 | Tsang | 357/52 |
| 4,374,867 | 2/1983 | Nahory et al. | 427/38 |

FOREIGN PATENT DOCUMENTS 0008898 8/1979 European Pat. Off. .
64231181 1/1989 Japan .

OTHER PUBLICATIONS

H. Barbe et al., "The growth of thin oxide layers on GaAs in methanol", *Semiconductor Science and Technology*, vol. 3, pp. 853–858 (1988). No month for reference.

J. P. Contour, et al., "An XPS Study of the Passivating Oxide Layer Produced on GaAs (001) Substrate by Heating in Air above 200 C.", *Japanese Journal of Applied Physics*, vol. 27, No. 2, pp. L167–L169 (Feb. 1988).

S. P. Murarka, "Thermal oxidation of GaAs", *Applied Physics Letters*, vol. 26, No. 4, pp. 180–181 (Feb. 25, 1975).

R. P. H. Chang et al., "Plasma oxidation of GaAs", *Applied Physics Letters*, vol. 29, No. 1, pp. 56–58 (Jul. 1, 1976).

Y. Gao et al., "Growth of Al oxide layers on GaAs (100) by reaction with condensed molecular oxygen", *Journal of Applied Physics*, 87(11), pp. 7148–7151 (Jun. 1, 1990).

C. W. Wilmsen et al., "The Improvement of Grown Oxides for the Surface Protection of III–V Compounds", *Thin Solid Films*, 51, pp. 93–98 (1978). No Month supplied with date of reference.

M. Hirose et al., *Physica Status Solidi*, (a)45, pp. K175–K177 (1978). No month on reference.

J. M. Dallesasse et al., "Environmental degradation of $Al_xGa_{1-x}As$–GaAs quantum–well heterostructures" *J. Appl. Phys.*, vol. 68, No. 5, pp. 2235–2238 (Sep. 1, 1990).

R. P. Chang et al., "Physical and electrical properties of plasma–grown oxide on $Ga_{0.64}Al_{0.36}As$" *J. Appl. Phys.*, vol. 48, No. 12, pp. 5384–5386 (Dec. 1977).

(List continued on next page.)

*Primary Examiner*—Georgia Y. Epps
*Attorney, Agent, or Firm*—Martin Novack

[57] ABSTRACT

A method of forming a native oxide from an aluminum-bearing Group III-V semiconductor material is provided. The method entails exposing the aluminum-bearing Group III-V semiconductor material to a water-containing environment and a temperature of at least about 375° C. to convert at least a portion of said aluminum-bearing material to a native oxide characterized in that the thickness of said native oxide is substantially the same as or less than the thickness of that portion of said aluminum-bearing Group III-V semiconductor material thus converted. The native oxide thus formed has particular utility in electrical and optoelectrical devices, such as lasers.

13 Claims, 14 Drawing Sheets

OTHER PUBLICATIONS

*The Anadic Behavior of metals and Semiconductors Series,* vol. 4, "Oxides and Oxide Films", John W. Diggle and Ashok K. Vijh, Eds. Marcel Dekker, Inc., pp. 190–191, 250–251 (1976). No month for reference.

Comprehensive Inorganic Chemistry, J. C. Bailar Jr. et al., Eds. Pergamon Press, pp. 1032–1036, 1090–1093 (1973). No month for reference.

C. Misra, *Industrial Alumina Chemicals,* ACS Monograph 184, pp. 1–165 (1986). No month for reference.

V. G. Hill et al. "The System Alumina–Gallia–Water", *Journal of the American Ceramic Society,* vol. 35, No. 6, pp. 135–142 (Jun. 1, 1952).

G. C. Kennedy, "Phase Relations in the System $Al_2O_3$–$H_2O$ at High Temperatures and Pressures", *American Journal of Science,* vol. 257, pp. 563–573 (Oct. 1959).

S. Matsushima et al., "A Study of Equilibrium Relations in the System S of $Al_2O_3$–$SiO_2$–$H_2O$ and $Al_2O_3$–$H_2O$", *American Journal of Science, vol. 265, pp. 28–44, (Jan., 1967).*

E. M. Levin et al., *Phase Diagrams for Ceramists* (1964) and *Phase Diagrams for Ceramists 1975 Supplement,* M. Reser, Ed., The American Ceramin Society, Figures 1926, 1927, 4021, 4965, 2008 and 310. No month for reference.

M. Rubenstein, "The Oxidation of GaP and GaAs", *Journal of Electrochem. Soc.,* vol. 113, No. 6, Jun., 1966, pp. 540–542.

B. Schwartz, "Preliminary Results on the Oxidation of GaAs and GaP during Chemical Etching", *Journal of Electrochem. Soc.,* vol. 118, No. 4, Apr. 1971, pp. 657–680.

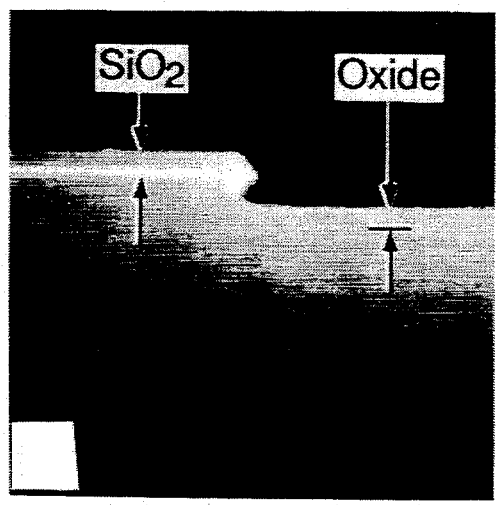
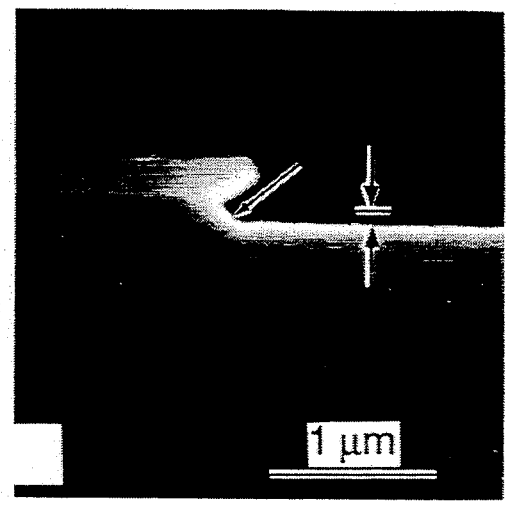
FIG.5a          FIG.5b
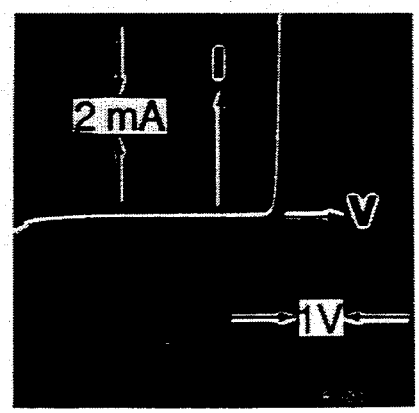
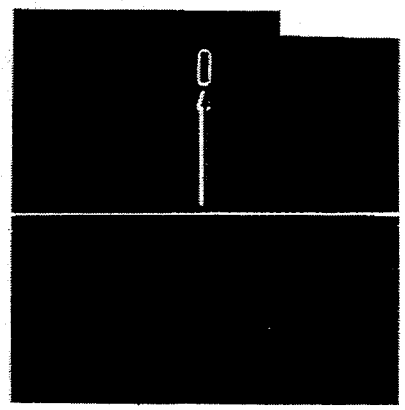
FIG.6a          FIG.6b

SEMICONDUCTOR DEVICES WITH NATIVE ALUMINUM OXIDE REGIONS

This invention was made, in part, with Government support under contract DAAL 03 89-K-0008 awarded by the United States Army and Grants NSF ECD 89-43166 and NSF DMR 89-20538 awarded by the National Science Foundation. The Government has certain rights in the invention. This application is a continuation-in-part of U.S. patent application Ser. No. 636,313 filed Dec. 31, 1990 now abandoned.

This is a divisional of copending U.S. application Ser. No. 721,843 filed Jun. 24, 1991, now U.S. Pat. No. 5,262,360, which is a continuation-in-part of U.S. application Ser. No. 636,313, filed Dec. 31, 1990, now abandoned.

BACKGROUND OF THE INVENTION

1. Field of the Invention

The present invention relates to a method of forming a high quality, stable and compact native oxide layer from an aluminum-bearing Group III-V semiconductor material. More specifically, the present invention forms the native oxide layer by a method involving wet thermal oxidation. Importantly, the thickness of the native oxide layer produced by the method is substantially the same as or less than the thickness of the aluminum-bearing Group III-V material layer that converts to the oxide. Further, the present invention forms the native oxide under conditions that discourage the formation of various other oxygen-rich compounds, such as aluminum oxide hydrates and aluminum suboxides, the presence of which compounds cause an expansion of the resultant native oxide layer thickness and are generally deleterious to the electrical and physical properties of the semiconductors.

The present invention is also directed to devices utilizing the native oxide layer thus grown, including electrical and optoelectrical devices such as transistors, capacitors, waveguides and, more especially, lasers.

Finally, the present invention relates to the masking and passivation of semiconductors utilizing the native oxide that forms from the practice of the present invention.

2. Description of the Prior Art

An important trend in semiconductor technology is the use of Group III-V materials for the fabrication of semiconductor devices. While the utilization of silicon (Si) is still prevalent in this area, Group III-V compounds—such as GaAs—have been the subject of much research due to the significant advantages these compounds offer. For example, Group III-V compounds generally exhibit larger band gaps, larger electron mobilities and have the ability to produce light, which properties result in unique electrical and optical characteristics.

Notwithstanding these qualities, Group III-V semiconductor technology has failed to develop at the rate and to the level of silicon-based technology. The primary causative factor to this end has been the inability to produce, on the Group III-V semiconductor, an oxide layer of desired thickness that exhibits the necessary surface state and electrical properties required for practical application. In this regard, the oxide must be able to fulfill, without the disruption and strain caused by over-expansion of the oxide thickness, a variety of functions in a practical and consistent manner. Examples of these functions include: serving as a mask during device fabrication, providing surface passivation, isolating one device from another (dielectric isolation, as opposed to junction isolation), acting as a component in the anatomy of various device structures and providing electrical isolation of multilevel metallization systems. Accordingly, the presence of a high-quality, stable oxide layer having adequate physical properties and proper thickness is essential to the successful development of Group III-V semiconductor technology.

Silicon-based materials, unlike Group III-V semiconductors, readily form a high quality oxide ($SiO_2$) by such methods as reacting the silicon crystal with water vapor, e.g., in the form of steam. Indeed, the very existence of silicon-based integrated circuit technology is largely due and owing to this ability of silicon to form a high quality silicon oxide. Moreover, this oxide is a native (or natural) oxide, as opposed to a deposited oxide layer. Native oxides are more desirable than deposited oxides in that they are monolithic with the crystal and thus avoid potential mismatching of dielectric characteristics and problems associated with oxide-substrate interface bonding, such as lifting and cracking. Further, deposition processes are on the whole more complicated and costly than are methods of growing a native oxide thus making the latter more attractive for commercial use.

Attempts at producing a quality native oxide layer on Group III-V semiconductors by adapting methods that have been successful for silicon have had disappointing results. These results are usually ascribed to the fact that the behavior of Group III-V materials depends, in large part, on the behavior of the individual Group III-V constituents, which behavior, under given circumstances, may not be compatible with the desired end result. For example, thermal oxidation techniques, which are regarded to be among the simplest of the techniques and which have had tremendous success for silicon, have not worked well for Group III-V materials such as GaAs. This is because gallium (Ga) and arsenic (As) have different oxidation rates, and because the $As_2O_3$ and $As_2O_5$ that are produced in the normal course of events, are volatile: once formed, they tend to boil off the substrate rather than stabilize on it as part of an oxide layer.

Thus other approaches which for the most part occur at low temperatures, e.g., room temperature, to avoid the formation of volatile components, to produce a native oxide layer directly from a Group III-V semiconductor surface have evolved. These techniques include the use of ozone, simultaneous $O_2$ and electron beam exposure, photo-excitation of electron-hole pairs (in GaAs), use of more reactive oxidizers (such as $N_2O$), photochemical excitation of the gas-phase molecular species, addition of water to the $O_2$, excitation of $O_2$, with a hot filament or a Tesla discharge plasma excitation of the $O_2$ and exposure to a high kinetic beam of atomic oxygen. The drawback of these techniques, aside from their overall complexity, which makes them unrealistic for large scale utility, is that although they can increase the rate of formation of the first few monolayers of oxide they are (with the possible exception of plasma oxidation and exposure to a high kinetic beam of atomic oxygen) generally ineffective for rapidly growing layers having a thickness in the range of hundreds to thousands of angstroms, Å (10,000 Å=1 micron, μm). Moreover, these oxidation reactions are often incomplete, the Ga and As not being in their highest formal oxidation state. The resulting oxide is thus usually deficient in Ga or As, which deficiencies have adverse effects on oxide quality.

Particular examples of these methods include: U.S. Pat, No. 3,859,178 wherein an oxide is grown on the surface of a GaAs layer by submersing the GaAs layer into an anodization bath of concentrated hydrogen peroxide ($H_2O_2$) having a pH of less than 6.

U.S. Patent No. 4,374,867 describes a method of growing an oxide layer on InGaAs by using a growth chamber that has been evacuated and in which an oxygen plasma has been established. Water vapor is introduced into the chamber to facilitate the growth process.

U.S. Pat. No. 3,890,169 relates a method of forming an oxide on GaAs in an electrolytic fashion using $H_2O_2$ as an electrolyte. The oxide thus formed is rendered more stable and more impervious to impurities and dopants normally employed in diffusion processes by being dried in oxygen at 250° C. for 2 hours followed by annealing at 600° C. for 30 minutes.

U.S. Pat. No. 3,914,465 describes a double oxidation technique whereby a native oxide is grown on GaAs by immersion in an aqueous $H_2O_2$ solution with a pH of 1.5-3.5, followed by a second oxidation in aqueous $H_2O_2$ at a pH of 6-8.

H. Barbe, et al. in *Semiconductor Science and Technology*, 3, pp. 853-858 (1988) describe the growth of a thin oxide layer on GaAs in methanol having a varying water content, without the application of external voltage. J. P. Contour, et al. in the *Japanese Journal of Applied Physics*, Vol. 27, No. 2, pp. L167-L169 (Feb. 1988) report on the preparation of a surface oxide on a GaAs substrate by heating the substrate to 250°-350° C. in air. Similarly, in *Applied Physics Letters*, Vol 26, No. 4, pp. 180-181 (Feb. 15, 1975), the growth of an oxide film on GaAs by thermal oxidation at 350°, 450° and 500° C. is described. *Applied Physics Letters*, Vol. 29, No. 1, pp. 56-58 (Jul. 1, 1976) reports on a one step dry process to form an oxide film on GaAs by plasma oxidation using an oxygen plasma.

Because of the complexity of these techniques and the less-than-desirable results in terms of physicality and thickness obtained, all of which can be related to the difficulties in working with Ga and As, methods of oxide formation have been developed which involve overlaying or implanting on a Group III-V surface a material that can oxidize more readily. Aluminum (Al) and aluminum-bearing compounds are examples of such materials. These particular materials are particularly adaptable in that aluminum is a Group III element and is known to oxidize more easily than the other elements normally found in Group III-V semiconductors.

Examples of oxidation methods which exploit the presence of aluminum or aluminum-bearing compounds include U.S. Pat. No. 4,144,634 which first deposits a thin layer of Al by, e.g., evaporation, over a GaAs substrate. The Al overlay is then oxidized by plasma oxidation. Y. Gao, et al. report in the *Journal of Applied Physics*, 87, (11), pp. 7148-7151 (Jun. 1, 1990) a cryogenic technique whereby molecular oxygen is first overlaid on a GaAs surface; deposition of Al follows. The Al reacts to form an oxide layer until the oxygen is depleted.

C. W. Wilmsen, et al. in *Thin Solid Films*, 51, pp. 93-98 (1978) report a method whereby a metal, such as Al, is implanted into a Group III-V substrate; oxidation then occurs by thermal or anodic means. M. Hirose, et al. relate in *Physica Status Solidi*, (a) 45, pp. K175-K177 (1978) an oxidation process for GaAs in which oxygen gas, admitted close to the substrate surface, is reacted with Al molecular beams to form $Al_2O_3$. Finally, U.S. Pat. Nos. 4,216,036 and 4,291,327, and European Patent Application 0 008 898 describe the fabrication of oxides by the thermal oxidation of an AlAs or AlGaAs layer which has been epitaxially grown on GaAs. The oxidation occurs in a flowing gas mixture of 80% $O_2$ and 20% $N_2$, and can occur in the presence of water vapor in order to permit the use of lower temperatures, e.g., 70°-130° C.; the oxides produced by this method are, however, believed to be aluminum arsenic oxide and/or hydrated aluminum oxides. These types of oxygen-rich aluminum compounds do not have the requisite physical characteristics that are necessary for semiconductor application; moreover, their presence in any modest amounts is deleterious to semiconductor structure. In addition to this, and integrally related to the presence of hydrates, is the expansion of thickness in the final oxide layer, which is consistently 80% thicker than the thickness of the original AlAs epilayer. In terms of real application and device construction, this magnitude of layer expansion is wholly impractical in that it distorts and strains the device architecture to unacceptable levels and puts inter-dependent dimensions and geometry out of kilter. These shortfalls are especially harmful when the semiconductor device is an optoelectrical device such as a laser, the optical output efficiency and lifespan of which is highly dependent on proper crystal dimensioning and geometry as the various layers are developed over the course of device fabrication.

In brief, prior art methods which rely on the presence of materials such as aluminum, are either too complex for large scale use or result in oxides that contain significant amounts of hydrates and/or have thicknesses which are over-expanded. The oxides produced by these methods also have less-than-desirable physical and electrical characteristics, in that they have poor electrical properties, e.g., significant leakage, and the overall quality of their physical state is not good. As to the latter, oxides formed by these known methods exhibit non-uniformities in density and continuity, and also lack suitable stability, which results in lifting, cracking and out-diffusion; devices fabricated with oxides grown by these methods show a strong tendency to degrade in unacceptably short periods of time under normal conditions of use and atmospheric exposure. These undesirable end results and deleterious effects thus preclude the use of these methods in large scale practical application as required for commercial devices.

Thus the semiconductor art, although producing a variety of methods to form oxides on Group III-V semiconductor materials, recognizes a continuing need for a method of growing an improved, high-quality native oxide on aluminum-bearing Group III-V semiconductor materials, particularly a native oxide whose thickness is substantially the same as or less than the thickness of the semiconductor material from which it forms. Moreover, it is desirable that the method be simple, cost effective and produce the native oxide consistently in a controlled and repeatable manner.

SUMMARY OF THE INVENTION

A new method of growing a high-quality native oxide on an aluminum-bearing Group III-V semiconductor has now been developed. The native oxide thus grown exhibits a proper range of conversion thickness and has superior physical and electrical characteristics as compared to oxides grown by methods known heretofore. Specifically, the native oxide layer grown by the method of the present invention has a thickness which is substantially the same as or less than the thickness of that portion of aluminum-bearing Group III-V material from which it forms. The native oxide layer thus grown is denser and more stable than oxide layers formed from prior art methods, meaning, for example, that they do not degrade under conditions of normal use and atmospheric exposure. Further, the native oxide grown in accordance with the present invention manifests operating and performance characteristics that surpass those of any other currently used oxide film. For example, the native oxides formed from the present invention exhibit excellent metallization adherence and dielectric properties. The native oxides formed by the method of the invention are particularly useful in optoelectrical devices, such as lasers, which can tolerate oxide layer contraction but are acutely affected by over-expansion in oxide layer thickness. Lasers thus fabricated are capable of long-term, high power output before burn-out occurs.

In accordance with the present invention, a method of growing a native oxide on the surface of an aluminum-bearing Group III-V semiconductor material is provided. The method comprises exposing an aluminum-bearing Group III-V semiconductor material to a water-containing environment and a temperature of at least about 375° C. to convert at least a portion of The aluminum-bearing Group III-V semiconductor material to a native oxide. The native oxide is characterized in that the thickness of said native oxide is substantially the same as or less than the thickness of that portion of said aluminum-bearing Group III-V semiconductor material thus converted.

In further accordance with the subject invention semiconductor devices utilizing the native oxide thus grown are provided. Devices of particular applicability in this regard include electrical and optoelectrical devices such as transistors, capacitors, waveguides and, more especially, lasers.

In still further accordance with the instant invention the masking and passivation of semiconductors utilizing the native oxide that forms from the present method is also described.

BRIEF DESCRIPTION OF THE DRAWINGS

FIG. 5(a) is a scanning electron microscope photomicrograph showing quantum well heterostructure (QWH); the left side of FIG. 5(a) shows the QWH with an $SiO_2$ mask; the right shows the QWH with the GaAs cap removed. The exposed crystal where the GaAs cap was removed was oxidized according to the present invention at 400° C. for 3 hours in an atmosphere of nitrogen and water vapor. FIG. 5(b) shows the QWH after the oxide on the right side was selectively removed. The slanted arrow in FIG. 5(b) shows the crystallographic facet defined by the natural oxide on the $Al_xGa_{1-x}As$ (x of about 0.8) confining layer.

FIG. 6(a) shows the current versus voltage (I-V) characteristics for the contact on the GaAs cap layer of the left-side masked region ($SiO_2$ removed) of the QWH of FIG. 5; FIG. 6(b) shows the I-V characteristic for the contact of the right-side, region having the native oxide as formed according to the present invention. FIG. 6(a) exhibits p-n conduction and FIG. 6(b) an open circuit ($I \approx 0$).

FIG. 9 is a photomicrograph showing the surface of a multiple-stripe contact region, as prepared using a native oxide that was formed in accordance with the present invention, on a $Al_xGa_{1-x}As$-GaAs (x of about 0.8) QWH crystal.

FIG. 21 shows that chemical attack was about 1 μm deep for Sample (a); no chemical attack at this depth was evidenced in Sample (b).

DETAILED DESCRIPTION OF THE INVENTION

Figure 1:
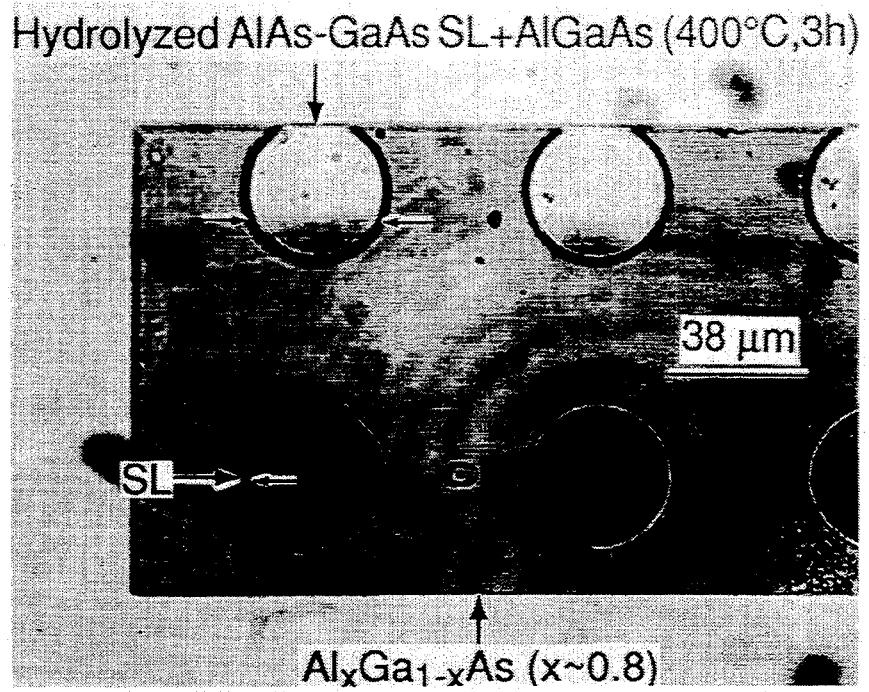
FIG. 1 shows a thin platelet of disorder-defined red-gap AlAs-GaAs superlattice (SL1) discs surrounded by yellow-gap $Al_xGa_{1-x}As$ (where x is about 0.8) after oxidation by the present invention at 400° C. and 3 hours in an atmosphere of nitrogen and water vapor. The top row of SL discs (representing a coarse-scale alloy) had exposed cleaved edges which were converted by the present invention to native oxide to a depth of 24 μm beyond the crystal edge (indicated by the small horizontal arrows). The oxide thickness of the 24 μm region was substantially the same as the thickness of that portion of the original SL1 material that was converted. The oxide was transparent in appearance.

The present invention provides a method of forming a high-quality native oxide from a Group III-V semiconductor material where the thickness of the native oxide is substantially the same as or less than the thickness of that portion of said Group III-V semiconductor material which is converted to the native oxide. The native oxide formed by the present invention is especially utile in the fabrication of electrical and optoelectrical active devices, including capacitors, transistors, waveguides and lasers, such as stripe-guided lasers, surface emitters and lasers whose active regions, as normally defined by their quantum well structures, are slightly mismatched in order to lengthen the wavelength of the energy emitted. An example of such a device is one having a first quantum well formed of, e.g., InGaAs inside of a second quantum well formed of, e.g., GaAs. The native oxide formed by the method of the present invention can also be used to define various geometries and patterns on the surfaces of Group III-V semiconductor materials in order to create any number of different configurations and topologies.

The method of the present invention finds particular utility in forming a native oxide from an aluminum-bearing Group III-V semiconductor material. Although the scope of the present invention is independent of any theory explaining its superior results, it is theorized that the present invention forms the native oxide in a manner that discourages the formation of debilitating amounts of hydrated and/or oxygen-rich aluminum compounds that are believed primarily responsible for the increase in thickness of native oxide layers grown in accordance with wet thermal oxidation techniques known heretofore, relative to the thickness of that portion of aluminum-bearing material so converted. In another aspect, it is believed that the present invention forms the native oxide in a manner that favors the formation of sufficient amounts of anhydrous forms of aluminum oxide and/or aluminum oxide hydroxides (referred to herein as dehydrated aluminum compounds) such that the thickness of the native oxide layer thus formed is substantially the same as or less than the original thickness of that portion of the aluminum-bearing Group III-V material converted to the native oxide.

As to the aforementioned oxygen-rich aluminum compounds, these include, e.g., compounds having the formula AlO, $Al_2O$ and $Al_2O_2$. These compounds, which are deleterious to semiconductor performance and stability, are referred to herein as aluminum suboxides.

The aforementioned hydrated compounds that are believed to form in undesirable amounts when employing wet thermal oxidation methods known heretofore, and are accordingly believed to contribute to the poor quality arid increased thickness of native oxides thus formed, include aluminum hydroxides and aluminum oxide hydrates as hereinbelow defined.

As to aluminum hydroxides, the most well-defined crystalline forms include the three trihydroxides having the general formula $Al(OH)_3$, which are conventionally denominated as gibbsite (also known as hydragillite in European literature), bayerite and norstrandite. The deleterious effects of these aluminum hydroxides relative to semiconductor application are believed related to the triply hydroxylated status of the aluminum.

As to the aluminum oxide hydrates, these are formed from the intermediate or transitional forms of aluminum oxide, $Al_2O_3$ generally identified as: 7-$Al_2O_3$, X-$Al_2O_3$, $\delta$-$Al_2O_3$, $\theta$-$Al_2O_3$, k-$Al_2O_3$ and L-$Al_2O_3$. These intermediate species of aluminum oxide normally exist between the compositional range of true anhydrous aluminum oxide and the hydroxide forms of aluminum. Accordingly, some of these intermediate species can form hydrates of the formula $Al_2O_3 \cdot nH_2O$ ($0 < n < 0.6$). It is the hydrates which form from these intermediate aluminum oxides that are referred to herein as aluminum oxide hydrates. It is further believed that the greater the degree of hydration, e.g., trihydrate versus monohydrate, the greater the degree of expansion in native oxide layer thickness.

One technique of determining the extent of hydration in an oxide layer is by measuring the index of refraction (denoted as "n"), which those of skill in the art will appreciate as correlatable to dielectric constant. As a rule, the larger the index of refraction, the greater the degree of hydration of the oxide layer and the more unsuitable that oxide is for practical semiconductor application. Thus the index of refraction for hydrated aluminum compounds such as, e.g., aluminum oxide hydrates, is for practical purposes generally in the range of between about 2.5 to about 5.0. In comparison, the index of refraction for anhydrous oxides is generally in the range of less than about 2.0. For example, a dehydrated film of GaAs-oxide formed by gas plasma oxidation has an index of refraction, as measured by conventional ellipsometer techniques, of about 1.78 to about 1.87; dehydrated arsenic oxide ($As_2O_3$) has an index of refraction of about 1.93. Generally, anhydrous aluminum oxides and aluminum oxide hydroxides have an index of refraction of less than about 2.0.

In addition to forming the native oxide in a manner that discourages the formation of debilitating amounts of hydrated and/or oxygen-rich aluminum compounds as hereinabove described, it is believed that the present invention forms the native oxide in a manner that favors the formation of sufficient amounts of anhydrous forms of aluminum oxide and/or aluminum oxide hydroxides to thus obtain a native oxide having the requisite physical and electrical properties required for practical semiconductor application, as well as a thickness that is substantially the same as or less than the thickness of the aluminum-bearing material that is converted to native oxide by the practice of the present invention.

In this regard, a native oxide thickness that is substantially the same as or less than the thickness of the aluminum-bearing material that is converted can be measured, for purposes of the present invention, by the ratio of native oxide thickness to the thickness of the aluminum-bearing material thus converted. As contemplated by the present invention, this ratio is within the range of between about 0.6 to about 1.1 (representing a shrinkage of the native oxide layer compared to the portion of aluminum-bearing material so converted of about 40%, to an expansion of the same of about 10%) without adversely affecting the physics of the native oxide formed.

As to the anhydrous forms of aluminum oxide, these include $\alpha$-$Al_2O_3$ and $\gamma$-$Al_2O_3$. It is important to the appreciation of the present invention to understand that stoichiometrically there is only one oxide of aluminum—namely, $Al_2O_3$—and that this oxide is polymorphic: it exists in a variety of crystalline forms which have different structures, most of which are substandard insofar as useful semiconductor-related electrical and physical properties are concerned. Generally, the forms of aluminum oxide that manifest the highest degree of parameters necessary for practical semiconductor application are the anhydrous forms, including $\alpha$-$Al_2O_3$ and $\gamma$-$Al_2O_3$.

For example, $\alpha$-$Al_2O_3$ has a well-defined, close packed lattice arrangement, and exhibits extreme hardness, stability, resistance to wear and abrasion, chemical inertness (including insolubility in, and unreactivity toward, water), outstanding electrical properties (such as dielectric character), good thermal shock resistance, dimensional stability and high mechanical strength.

As to aluminum oxide hydroxides, these include the two well-defined crystalline phases having the general formula AlO(OH) which phases are conventionally denoted as diaspore and boehmite.

It is believed that the native oxide formed in the practice of the present invention is formed in a manner such that sufficient amounts of the anhydrous forms of aluminum oxide and/or aluminum oxide hydroxides result, rather than debilitating amounts of the hydrated and/or oxygen-rich aluminum compounds, and further believed that this circumstance is manifested in the fact that the thickness of the native oxide formed in the practice of the present invention is substantially the same as or less than the thickness of the aluminum-bearing material that is so converted.

Molar volume serves as an indicator in this regard. That is, the fact that the thickness of the native oxide of the present invention is substantially the same as or less than the thickness of that portion of the aluminum-bearing material that converts to the native oxide is believed to indicate that the present invention forms a native oxide of compounds that have a molar volume substantially the same as or less than that of the aluminum-bearing Group III-V semiconductor material from which the native oxide forms.

Molar volume can be established from the following formula:

Molar Volume = Molecular Weight ÷ Density

The molar volumes for AlAs (an aluminum-bearing Group III-V material contemplated by the instant invention), $\alpha$-Al$_2$O$_3$ and $\gamma$-Al$_2$O$_3$ (anhydrous forms of aluminum oxide, as defined by the present invention), diaspore (an aluminum oxide hydroxide, as defined by the present invention) and gibbsite (an aluminum hydroxide, as defined by the present invention) and aluminum mono- and tri-hydrate (aluminum oxide hydrates, as defined by the present invention) are listed in Table 1, below:

TABLE 1

| Substance | Molar Weight, g | Molecular Density, g/cc | Volume, cc/mol |
|---|---|---|---|
| $\alpha$-Al$_2$O$_3$ | 101.96 | 3.5–3.9 | 29.1–26.1 |
| $\gamma$-Al$_2$O$_3$ | 101.96 | 3.97 | 25.7 |
| gibbsite, Al(OH)$_3$ | 78 | 2.52 | 32.2 |
| diaspore, AlO(OH) | 60 | 3.3–3.5 | 18.2–17.1 |
| aluminum trihydrate, Al$_2$O$_3$ · 3H$_2$O | 156 | 2.42 | 64.5 |
| aluminum monohydrate, Al$_2$O$_3$ · H$_2$O | 199.98 | 3.014 | 39.8 |
| AlAs | 101.90 | 3.73 | 27.3 |
| GaAs | 144.64 | 5.316 | 27.2 |

As seen by reference to Table 1, the molar volumes of the anhydrous forms of aluminum oxide, $\alpha$- and -Al$_2$O$_3$, and the aluminum oxide hydroxide, diaspore, are substantially the same as or less than that shown for AlAs, thus indicating that an oxide formed from AlAs in practicing the present invention, wherein the native oxide has a thickness substantially the same as or less than that portion of AlAs form which it forms, may be comprised primarily of dehydrated aluminum compounds, i.e., the anhydrous forms of aluminum oxide and/or aluminum oxide hydroxide. In contrast, when the thickness of the native oxide formed from AlAs is greater than that portion of AlAs thus oxidized—as in the case in earlier attempts at producing a native oxide, such as by methods embodied in U.S. Pat. Nos. 4,216,036 and 4,291,327—this is believed to indicate that the native oxide thereof is comprised primarily of compounds whose molar volume is greater than AlAs, such as, e.g., aluminum monohydrate, aluminum trihydrate, and gibbsite—an aluminum hydroxide.

Similar to aluminum, gallium also forms an oxide, Ga$_2$O$_3$, that has a variety of crystalline forms; these crystalline modifications are denoted $\alpha$-Ga$_2$O$_3$, $\beta$-Ga$_2$O$_3$, $\gamma$-Ga$_2$O$_3$, $\delta$-Ga$_2$O$_3$, $\epsilon$-Ga$_2$O$_3$. Of these, $\beta$-Ga$_2$O$_3$ is the most stable and best suited for semiconductor use. Further, under proper circumstances, aluminum oxides, such as $\alpha$-Al$_2$O$_3$, and gallium oxides, such as $\beta$-Ga$_2$O$_3$, can form a solid solution and can form compounds of the formula GaAlO$_3$.

In the practice of the present invention, a native oxide is formed from a Group III-V semiconductor material; preferably an aluminum-bearing Group III-V semiconductor material such as, e.g., AlGaAs, AlInP, AlGaP, AlGaAsP, AlGaAsSb, InAlGaP or InAlGaAs.

In a practical embodiment of the present invention, the aluminum-bearing Group III-V semiconductor material is overlaid on the surface of an aluminum-free Group III-V semiconductor material such as, e.g., GaAs, GaP, GaAsSb, InGaP or InGaAs. When the thickness of the aluminum-bearing overlayer is not so great so as to impede the diffusion of the necessary oxidation reactants down through the entire aluminum-bearing layer, the conversion of the aluminum-bearing layer to the native oxide layer will essentially terminate at the aluminum-free Group III-V interface, or when the aluminum content of a given layer or interface layer is about 30% or less, e.g., x is about 0.3 in material such as Al$_x$Ga$_{1-x}$As. Diffusion effects, which can eventually terminate the oxidation reaction, normally become a factor when the aluminum-bearing material has a thickness of about 10,000 Å or more.

The method of the present invention entails exposing the aluminum-bearing Group III-V semiconductor material to an environment that contains water, preferably in the form of water vapor. In the preferred practice of this embodiment of the invention, the water vapor is present with one or more inert gases, such as nitrogen. The water vapor is also preferably present in an amount wherein the nitrogen or other inert gas or gases is substantially saturated with water. The water-containing inert gas environment is preferably, but need not be, under a condition of flow. When under flow, the rate should be at least about 0.5 standard cubic feet per hour (scfh), preferably about 1.0–3.0 scfh; most preferably about 1.5 scfh.

In practicing the present invention, a temperature of at least 375° C. is employed. Although no specific time period need elapse in order for the native oxide to form in the first instance, certain practices in this regard are preferred, especially in applications involving the more typical aluminum-bearing Group III-V semiconductor materials, such as Al$_x$Ga$_{1-x}$As where x is about 0.7 or greater.

Thus in a first embodiment of the present invention, wherein the temperature employed is in the range of from about 375° C. to about 600° C., preferably in the range of about 390° C. to about 500° C., more preferably in the range of about 400° C. to about 450° C., it is preferred if the exposure to the water-containing environment is for a time period of about 0.1 hour to about 6.0 hours. A more preferred time period for this first embodiment is about 1.0 hour to about 5.0 hours; even more preferred is a time period of about 2.0 hours to about 4.0 hours. Most preferred for this first embodiment is a time period of about 3.0 hours.

In a second embodiment of the present invention, referred to herein as rapid thermal processing, a temperature in the range of over about 600° C. to about 1100° C. is employed. In a preferred aspect of this second embodiment, the temperature employed is in the range of about 650° C. to about 1000° C.; more preferably about 700° C. to 900° C. and most preferably about 800° C. In the practice of this second embodiment of the present invention the exposure to the water-containing environment will depend upon whether the material is self-capping under the conditions employed. If not, exposure is preferably for a time period of up to about 120 seconds. A more preferred time period for this second embodiment is about 5 seconds to about 90 seconds; even more preferred is a time period of about 10 seconds to about 60 seconds with the most preferred time period for this second embodiment being about 15 to about 30 seconds.

The time periods preferred in the practice of this second embodiment of the present invention are abbreviated to account for the fact that certain Group III-V materials, such as arsenic, have a tendency to evaporate at the higher temperatures employed therein. Thus the short exposure times for these materials that are not self-capping are preferred in order to prevent or minimize any such losses.

In the practice of the present invention, particularly in the practice of the second embodiment described hereinabove, material to be oxidized in accordance therewith may be exposed to the aforedescribed temperatures in the first instance, or alternatively, may be heated to these temperatures from a lower temperature, e.g., room temperature (about 20°-25° C.) in heating apparatuses, such as conventional annealing furnaces or ovens, that are capable of reaching these temperature ranges in about 2 seconds or less, preferably in about 1 second or less.

In any event, in practicing the present invention the temperature need not be held constant. Thus for example, within the ranges elucidated above the temperature may be ramped up or down. These temperature ranges are believed to discourage any appreciable formation of hydrated aluminum compounds and/or aluminum suboxides in quantities that would deleteriously affect the final oxide and its utility for semiconductor purposes. At the same time, these temperature ranges are believed to encourage the formation of the desirable anhydrous forms aluminum oxide, such as $\alpha$-$Al_2O_3$ and/or aluminum oxide hydroxides, such as diaspore.

Other processing may occur subsequent to exposure of the aluminum-bearing Group III-V material to the water-containing environment without detrimentally affecting the native oxide that has formed. Thus the native oxide and the structure or article on which it has formed may be dried by removal from, or removal of, the water-containing environment, with heating being continued at the same or different temperatures than those used to form the oxide. Inert gas may also be passed over the native oxide-containing structure to facilitate drying. For example, in a flowing water vapor-nitrogen (or other inert gas) system at a temperature of, e.g., about 400° to 450° C., the flow of water vapor into the system may be stopped after, e.g., 0.25 hour; the flow of nitrogen gas continuing however for a period of time thereafter, e.g., 2 hours. The temperature of the flowing nitrogen system may be the same temperature as used during oxide formation, or the temperature can be ramped up or down, e.g., from 450° to 500° C.

Other processing that can occur subsequent to native oxide formation includes annealing. As conventionally preformed for Group III-V semiconductor materials, annealing takes place under "dry" conditions, that is in the absence of water. Dry conditions in this regard normally entail the use of an $N_2$ gas environment. Annealing can also take place under an over-pressure formed of materials having a tendency to vaporize at the thermal conditions employed to anneal. Thus the native oxide-containing structure may be sealed in an ampoule having, optionally, an overpressure of arsenic or phosphorous; the former being normally used for arsenic-containing Group III-V semiconductor materials (such as AlGaAs) the latter for phosphorous-containing Group III-V semiconductor materials (such as InGaP). Annealing is in either case generally performed at a temperature of over about 500° C. to about 850° C., preferably in the higher temperature ranges, e.g., 850° C., for a time of about 0.25 hour to about 4 hours, normally.

The following Examples are given to illustrate the scope of the present invention. Since the Examples are given for illustrative purposes only the invention should not be limited thereto.

EXAMPLE 1

OXIDATION OF $Al_xGa_{1-x}As$-AlAs-GaAs QUANTUM WELL HETEROSTRUCTURES AND SUPERLATTICES

AlAs-GaAs superlattices (SLs) were grown by metal-organic chemical vapor deposition techniques, as described by R. D. Dupuis. et al. in *Proceedings of the International Symposium on GaAs and Related Compounds*, edited by C. M. Wolfe, (Institute of Physics, London, 1979), pp. 1–9 and by M. J. Ludowise, *J. Appl. Phys.*, 58, R31 (1985). Several SLs were employed, each about 1 micron ($\mu$m) thick. Superlattices denoted as SL1 had AlAs barriers having an $L_B$ size of about 150 Å, and GaAs wells of width $L_z$ of about 45 Å. Superlattices denoted as SL2 had an LB(AlAs) of about 70 Å and an $L_z$(GaAs) of about 30 Å. Although superlattices have a special character, i.e., size quantization, they are also regarded as being relatively "coarse", i.e., non-stochastic, $Al_xGa_{1-x}As$ alloys. In this Example, SL1 was roughly two times coarser than SL2. SL1 and SL2, with (100) surfaces, were rendered into random, or fine scale alloys, in a patterned form by impurity-induced layer disordering (IILD) by zinc (Zn) diffusion from $ZnAs_2$ at 575° C. for 0.5 hour as described by D. G. Deppe, et al. *J. Appl. Phys.*, 64, R93 (1988) and W. D. Laidig, et al. *Appl. Phys. Lett.*, 38, 776 (1981).

The SLs were masked with $SiO_2$ discs having a diameter of about 37 $\mu$m. The discs were deposited by chemical vapor deposition and patterned (by standard photolithography) in a rectangular array on centers of about 76 $\mu$m. After the Zn diffusion and the removal of the masking $SiO_2$, as well as the removal of the crystal substrates (by standard methods of mechanical lapping and wet chemical etching), completely smooth, yellow gap $Al_xGa_{1-x}As$ platelets (having a thickness of about 1 $\mu$m) with red gap SL discs (having diameters of about 37 $\mu$m) distributed in a uniform array were obtained, as described by N. Holonyak, et al., *Appl. Phys. Lett.*, 39, 102 (1981). The "fine" scale (yellow) and "coarse" scale (red) alloy, were now all in one sample, which sample was oxidized according to the method of the present invention: The samples were heated in a furnace at 400° C. for 3 hours in an $H_2O$ vapor atmosphere obtained by passing $N_2$ carrier gas (with a flow rate of approximately 1.5 scfh) through an $H_2O$ bubbler that was maintained at 95° C. The sample thus obtained by this method formed a native oxide having smooth, shiny surfaces, which were much shinier than before oxidation. This surface characteristic was indicative of a dense, compact oxide that was substantially free of alumina oxide hydrates, and that a major component of the native oxide thus formed was likely an anhydrous aluminum oxide, such as $\alpha$-$Al_2O_3$.

A cleaved section of SL1, which was oxidized according to the invention is shown in FIG. 1. The top edge of the 37 μm diameter SL discs was cleaved and arranged so to expose the edge of the SL samples (the discs) to the oxidation process of the present invention. The bottom row of discs was uncleaved and hence was exposed to the oxidation process of the present invention only at the surface (front and back). As FIG. 1 shows, the conversion of the cleaved SL discs to the native oxide was to a depth of about 24 μm as measured from the edge of the SL (as indicated by the small horizontal arrows). This oxide thickness was substantially the same as the thickness of the cleaved, exposed SL that was converted. No expansion of thickness for the native oxide layer was seen. As to the bottom row of discs, only a slight delineation of oxidation was evident on the periphery; some surface oxide was also present. Thus after oxidation by the method of the present invention, the upper row of discs appeared solid and were nearly totally clear across each disc, while the surrounding IILD $Al_xGa_{1-x}As$ (where x is about 0.8) material remained yellow in appearance and the bottom row of discs (SL1 with oxide surface) remained red.

Figure 2:
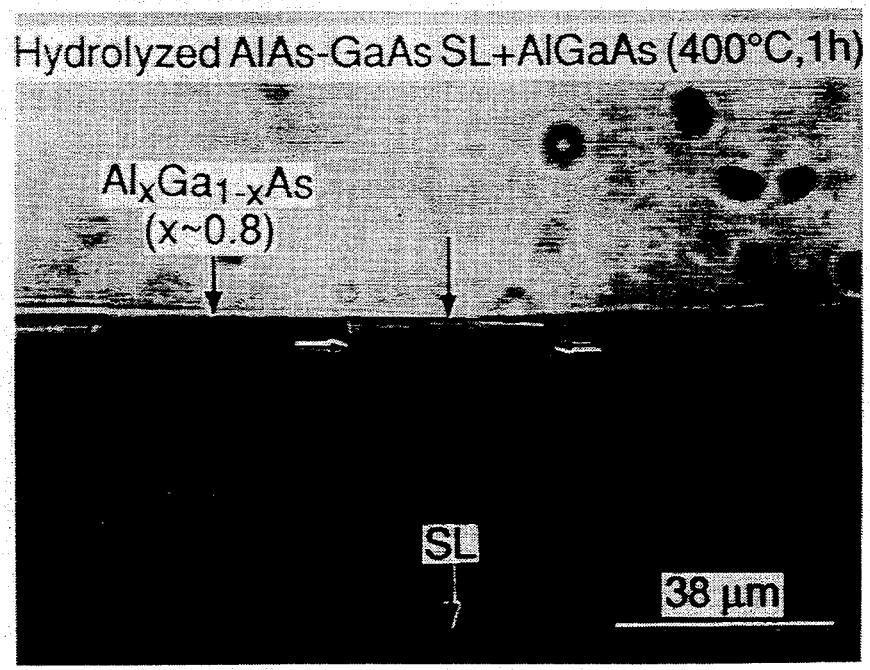
FIG. 2 shows an AlAs-GaAs superlattice (SL1) after oxidation by the present invention at 400° C. and one hour in an atmosphere of nitrogen and water vapor. Oxide conversion into the edge region of the SL disc was 3 μm (as indicated by small horizontal arrows). The oxide thickness of the 3 μm region was substantially the same as the thickness of that portion of the SL that was converted.
Figure 3:
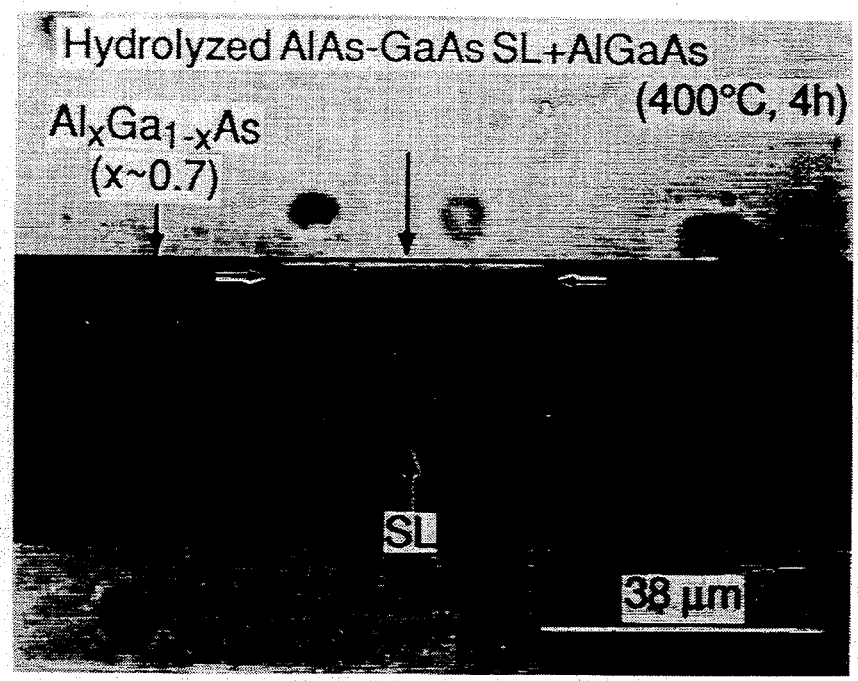
FIG. 3 shows an AlAs-GaAs superlattice (SL2) after oxidation by the present invention at 400° C. and 4 hours in an atmosphere of nitrogen and water vapor. SL2 was a finer scale alloy than was SL1 and the oxide formation was 2–3 μm into the edge of the SL disc. The oxide thickness of the 2–3 μm region was substantially the same as the thickness of that portion of SL2 that was converted. The slower conversion rate even at a longer time period relative to SL1 in FIGS. 1 and 2 was due to the finer alloy scale of SL2.

By reducing the time of the oxidation process from 3 hours to 1 hour (all other parameters were the see), the edge oxide conversion of an SL1 disc was to a depth of about 3 μm as measured from the edge of the SL as shown in FIG. 2 (as indicated by the small horizontal arrows). This depth (or thickness) was substantially the same as the depth (or thickness) of that portion of the SL disc that was converted to the oxide. No expansion or increase in the oxide thickness relative to the original SL thickness was seen. In FIG. 3, an SL2 ($L_B+L_z$ being about 100 Å) was oxidized for 4 hours, as opposed to the 3 hours in the case represented by FIG. 1. Edge oxidation of an SL2 disc, which is a finer-scale alloy than that represented by SL1, was to a depth of 2-3 μm as measured from the edge of the SL, even with the longer oxidation time. Nevertheless, the 2-3 μm oxide depth was substantially the same as the original SL thickness that was converted to oxide. No increase or expansion of oxide depth (thickness) was seen. The surrounding yellow gap $Al_xGa_{1-x}As$ material (where x was about 0.7) IILD alloy oxidized also, but not nearly as extensively; oxidation here was hardly noticeable at all except for the shiny surface. Thus a difference in the oxide conversion of $(Al_1As)_x(GaAs)_{1-x}$ alloy is seen when progressing from a coarser scale to a finer scale alloy, with random alloy and lower compositions converting much "slower". In all cases, however, the thickness of the oxide formed by the method of the invention was substantially the same as the thickness of that portion of the alloy that converts to the oxide.

FIGS. 1-3 also show that there is major anisotropy in how the oxide developed on $(AlAs)_x(GaAs)_{1-x}$ SLs. Oxidation normal to the layers was much "slower" than along the layers, and began to approach or become equal when the scale of the SL was finer. This is seen by comparing FIG. 3 (SL2 with $L_B+L_z$ approximately 100 Å) with FIG. 1 (SL1 with $L_B+L_z$ approximately 200 Å).

Figure 4:
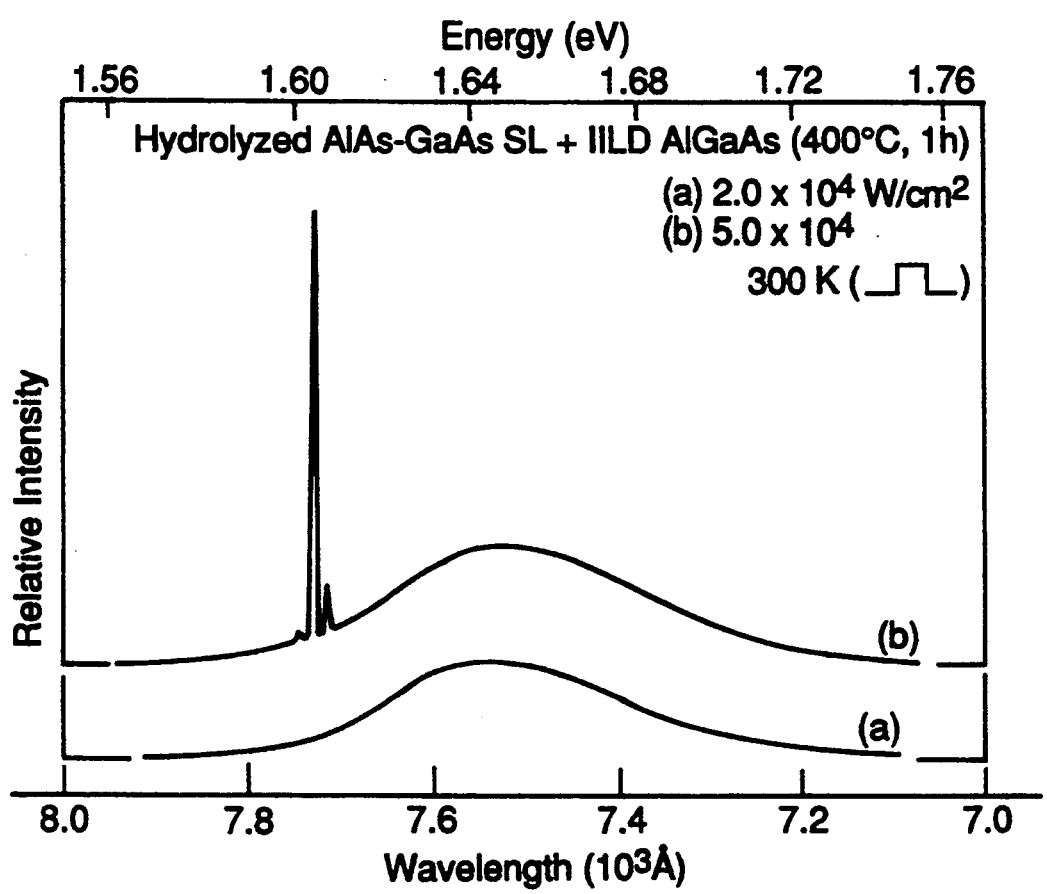
FIG. 4 shows the photopumped room temperature (300° Kelvin, K) laser operation of the red-gap SL1 discs of FIG. 2 which were oxidized by the present invention. The sample was compressed in an annealed copper heat sink under a diamond window.

The high quality of the oxide produced by the method of the present invention was demonstrated by way of a photopumped laser. FIG. 4 shows the photopumped laser operation of one of the inner (sealed edge) SL1 discs of FIG. 2; the sample was heat sunk compressed in annealed copper under a diamond window by conventional methods. The laser operation (at 300° K.) of this SL sample was possible even with the loss, by oxidation, of some of the layers on both sides of the red gap SL disc, and even with some oxidation non-uniformity at the disc periphery because of the crystal and doping difference (heavily p-type edge). It is believed that these results are attributable, at least in part, to the fact that the thickness of the native oxide produced was substantially the same as the thickness of that portion of the crystal that was converted to the oxide. That is, because the thickness of the native oxide thus formed was substantially the same as that portion of the SL layer that converted there was no appreciable distortion of the laser structure, meaning that high performance operation was possible.

EXAMPLE 2

NATIVE OXIDE-DEFINED SINGLE STRIPE GEOMETRY $Al_xGa_{1-x}As$-GaAs QUANTUM WELL HETEROSTRUCTURE LASERS

The use of native oxides formed in accordance with the present invention in the fabrication of gain-guided oxide-stripe quantum well heterostructure (QWH) lasers was investigated. These devices, formed by simplified processing, were found to have outstanding performance characteristics which were directly attributable to the quality of the native oxide and the fact that the thickness of the oxide was substantially the same as that portion of the crystal that was converted; thus the laser structure was not distorted or strained as would happen if the oxide thickness expanded.

The epitaxial layers for these laser structures were grown on n-type (100) GaAs substrates by metalorganic chemical vapor deposition (MOCVD) as described in the Dupuis, et al. reference cited in Example 1. An $Al_{0.8}Ga_{0.2}As$ lower confining layer was grown after a first GaAs buffer layer. The active region of the QWH was grown next; the active region consisted of symmetrical $Al_{0.25}Ga_{0.75}As$ waveguide layers (undoped; thickness of these layers was approximately 1000 Å) on either side of a GaAs quantum well (QW) which had a thickness of about 400 Å. Lastly, at the top of the QWH, a p-type $Al_{0.8}Ga_{0.2}As$ upper confining layer was grown to a thickness of about 9000 Å. The entire QWH was then capped by a heavily doped p-type GaAs contact layer having a thickness of about 800 Å.

Diodes were constructed by first depositing, by chemical vapor deposition (CVD), about 1000 Å of $SiO_2$ on the crystal surface. Using standard photolithography and plasma etching techniques, $SiO_2$ stripes, 10 μm wide, were defined on the wafer surface for purposes of masking. The crystal was then etched in $H_2SO_4:H_2O_2:H_2O$ (1:8:80) to remove the GaAs contact layer in areas not protected by the $SiO_2$ masking stripes. Except in the 10 μm wide stripe regions, this exposed the high composition $Al_xGa_{1-x}As$ (x of approximately 0.8) upper confining layer. A native oxide was then formed in accord with the method of the present invention from this exposed high aluminum-bearing composition of the upper confining layer. The QWH crystal was heated to about 400° C. for 3 hours in an $H_2O$ vapor atmosphere produced by passing an $N_2$ carrier gas (at a rate of about 1.4 scfh) through an $H_2O$ bubbler maintained at about 95° C. About 1500 Å of the exposed $Al_xGa_{1-x}As$ (x of about 0.8) layer was converted to native oxide. The oxide thus produced by this method had a thickness of about 1000-1500 Å which was substantially the same or less than the thickness of that portion of the exposed upper confining layer that was converted, and was clear and transparent and uniform blue in color (the blue being caused by optical effects). Following oxidation, the SiO$_2$ masking layer was removed by conventional plasma etching (CF$_4$ and 4% O$_2$). The native oxide was unaffected by the plasma removal of the SiO$_2$ layer.

FIG. 5 shows a cross section of the crystal before removal of the SiO$_2$ masking layer. The vertical arrows in FIG. 5(a) indicate, as labeled, the thicknesses of the SiO$_2$ layer (left side) and of the native oxide layer (to the right). FIG. 5(b) shows a cross section in which the native oxide (right side) has been removed by etching in a KOH-K$_3$Fe(CN)$_6$ mixture. The pair of vertical arrows in FIG. 5(b) indicates the location of the oxide prior to removal. FIG. 5 illustrates that the oxidation method of the present invention is somewhat sensitive to crystal orientation. For example, reference to FIG. 5 shows that where the oxide undercut the SiO$_2$ masking stripe and the GaAs contact layer, a tendency existed to develop a crystallographic step on the Al$_x$Ga$_{1-x}$As (where x was about 0.8) confining layer. This is shown by the small slanted arrow in FIG. 5(b). This sensitivity to crystal orientation indicates that the native oxide integrally conforms to the underlying crystal structure which means that bonding problems at the interface would be minimized or eliminated.

After the SiO$_2$ masking stripes were removed, the crystal was sealed in an ampoule for shallow Zn diffusion (ZnAs$_2$ source, 540° C., 25 min) to increase the GaAs stripe contact doping. The crystal was then metallized with titanium-platinum-gold (Ti-Pt-Au) across the native oxide onto the exposed GaAs contact stripe. The metallization adhered onto the native oxide much better than on oxides or other dielectrics formed by prior art methods where the metallization frequently peels. After the p-type side metallization, the crystal was thinned (to 100 μm) from the substrate side and was metallized on the n-type side with germanium-gold-nickel-gold (Ge-Au-Ni-Au). The wafer was then cleaved into Fabry-Perot bars, saw-cut stripe-contact sections were attached to copper heat sinks with indium (In) for continuous wave (cw) laser operation at room temperature, i.e., 300° K. Similar saw-cut sections with no contact stripes were prepared in order to investigate the blocking behavior of the oxide.

FIG. 6(a) shows the current versus voltage (I-V) characteristic of a diode prepared on the QWH crystal in the GaAs contact stripe region; FIG. 6(b) shows (same scale) the open-circuit diode that resulted when no contact stripe was present (i.e., the case of contact to a saw-cut section with only the native oxide on the crystal).

Figure 7:
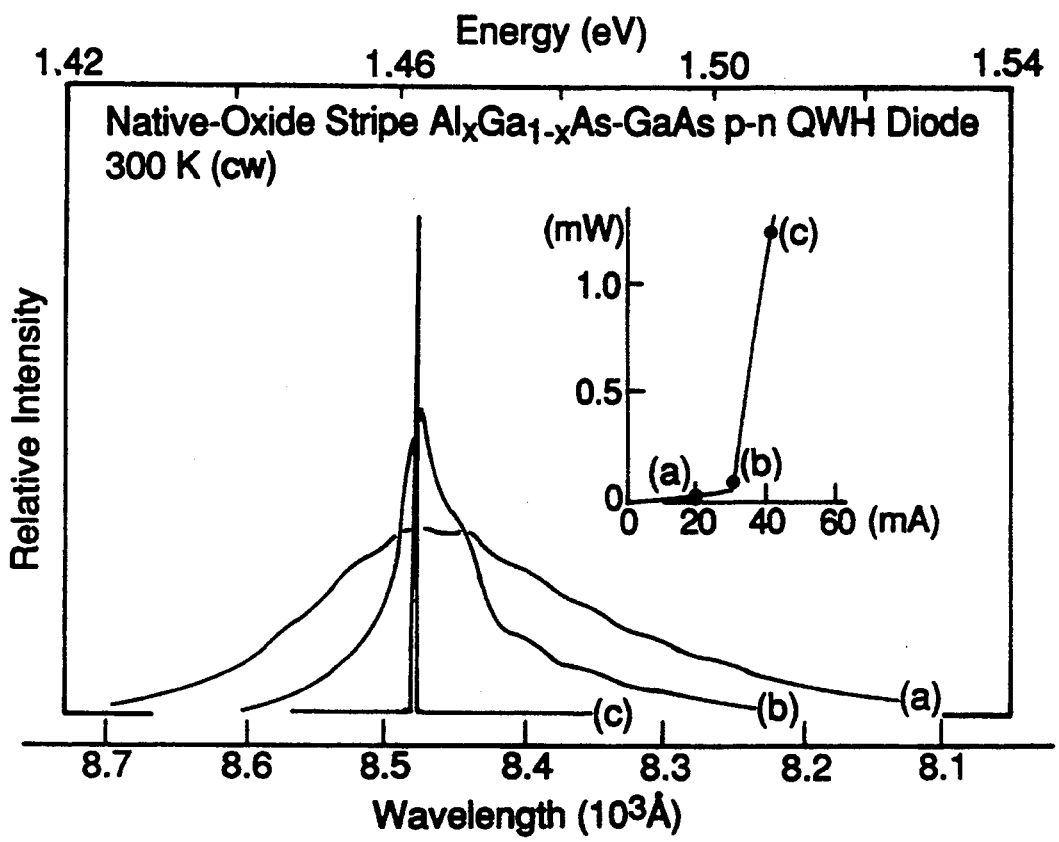
FIG. 7 shows the spectral behavior and the power versus current (L-I) characteristics of the QWH laser of FIG. 5 having the native oxide as grown according to the present invention at 20 milliamps, mA, 30 mA and 40 mA.

The high quality of these laser diodes was demonstrated by their operating characteristics (continuous wave at 300° K.). The diodes (having a cavity approximately 500 μm long) approached threshold, as shown in FIG. 7 by spectral curves labeled (a) 20 mA, (b) 30 mA, and (c) 40 mA. The corresponding points on the power versus current (L-I) curve are shown in the inset of FIG. 7. The power versus current characteristics exhibited a rather sharp corner, reminiscent of a distributed feedback or cleaved-coupled cavity diode. This suggested that the oxide, unlike those formed by method of the prior art, perhaps because of its sensitivity to crystal orientation, rippled or "milled" the crystal surface and provided some natural distributed feedback. As the diode approached threshold (FIG. 7) little tendency for multiple mode operation (spectral "ringing") was shown. Spectral curve (b) of FIG. 7 (30 mA) exhibited narrowing but no "ringing", and just above threshold a single mode was dominant as shown, in FIG. 7, at the higher current, (c) 40 mA.

Figure 8:
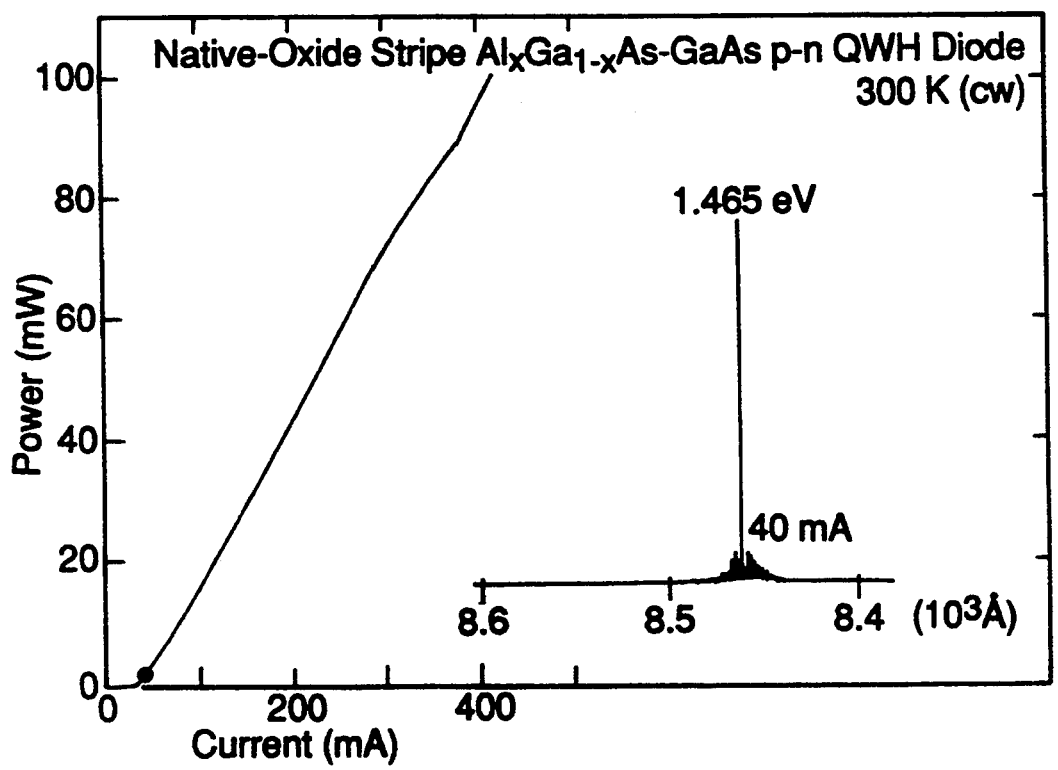
FIG. 8 shows the high power laser operation of the QWH laser of FIG. 5 which incorporates the native oxide as formed according to the present invention. Burn-out did not occur until over 100 milliwatts, mW/facet.

Because of the quality of these recessed oxide single-stripe diodes and the excellent adherence of the metallization on the natural oxide, they are easily attached with indium to a copper heat sink on the oxide side, thus providing very effective heat sinking in close proximity to the QWH active region. FIG. 8 shows the high power continuous wave laser operation that was possible. The power output per facet exceeded 100 mW before burn-out occurred.

Besides the high performance capability demonstrated by the oxide-defined laser diodes of this Example, one of their more notable features was their simple fabrication. Although a CVD SiO$_2$ layer to mask to define the 10 μm wide GaAs contact stripes was employed, elimination of this step can be accomplished simply by photolithography, which would make possible the fabrication of an oxide stripe laser free of any CVD processes.

EXAMPLE 3

NATIVE OXIDE-DEFINED MULTIPLE STRIPE Al$_x$Ga$_{1-x}$As-GaAs QUANTUM WELL HETEROSTRUCTURE LASERS

As demonstrated in Example 2, the more notable features of the native Al$_x$Ga$_{1-x}$As (x of about equal to or greater than 0.7) oxide that forms in accordance with the method of the present invention include how well it metallized, (thus employable in device heat sinking), and how, via ordinary photolithographic processes, the native oxide permitted delineation of device geometries without the need to deposit foreign and potentially mismatched dielectric materials (such as, SiO$_2$ or Si$_3$N$_4$). The present Example amplifies these features of the native Al$_x$Ga$_{1-x}$As (x as defined above) oxide formed in accordance with the present invention by constructing, with simplified processing, high performance ten-stripe Al$_x$Ga$_{1-x}$As quantum-well heterostructure (QWH) lasers. The considerable difference in the oxidation behavior of Al$_x$Ga$_{1-x}$As (x of about equal to or greater than 0.7) as compared to GaAs, which, relative to oxide formation, is much weaker and readily permits current-contact metallization, is shown.

The epitaxial layers for these coupled-stripe QWH lasers were grown on n-type (100) GaAs substrates by metal-organic chemical vapor deposition (MOCVD) as described in the Dupuis, et al. reference cited in Example 1. A GaAs buffer layer was grown first, followed by an n-type Al$_{0.8}$Ga$_{0.2}$As lower confining layer. The active region of the QWH was grown next and consisted of a GaAs quantum well (QW) having a thickness of about 400 Å with Al$_{0.25}$Ga$_{0.75}$As waveguide layers (undoped; having a thickness of about 1000 Å) on either side. Lastly, a p-type Al$_{0.8}$Ga$_{0.2}$As upper confining layer was grown to a thickness of about 9000 Å on top of the active region. The entire QWH was capped by a heavily doped p-type GaAs contact layer about 800 Å thick.

The GaAs contact layer was removed, where desired, to provide access to the upper confining layer for conversion of part of that layer to the native oxide by the method of the present invention. The GaAs contact layer did not oxidize readily, and consequently could be used directly as a mask (and then contact layer) when the native oxide formed from a portion of the upper confining layer. Standard photolithography was used to mask sets of ten GaAs stripes, 5 μm wide, located 2 μm apart (7 μm center-to-center spacing). The GaAs between the stripes (2 μm width), as well as the GaAs between sets of stripes, was removed with $H_2SO_4$:-$H_2O_2$:$H_2O$ (1:8:80). This exposed the high composition $Al_xGa_{1-x}As$ (x of about 0.8) upper confining layer to oxidation in accord with the present invention. The QWH was heated at 400° C. for 3 hours in an $H_2O$ vapor atmosphere obtained by passing $N_2$ carrier gas (having a flow rate of about 1.4 scfh) through an $H_2O$ bubbler maintained at 95° C.

Figures 9A, 9B:
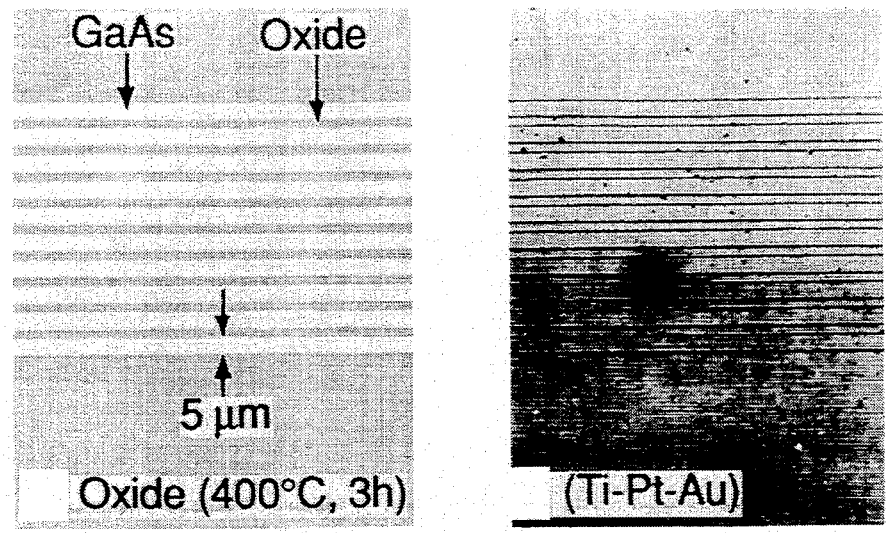
FIG. 9(a) shows the native oxide as formed at 400° C. for 3 hours in an atmosphere of nitrogen and water vapor, on the upper $Al_xGa_{1-x}As$ (x of about 0.8) confining layer where the QWH was not masked by a GaAs contact layer.
FIG. 9(b) shows the entire surface following metallization with titanium-platinum-gold (Ti-Pt-Au).

The QWH crystal after oxidation is shown in FIG. 9(a). The 5 μm GaAs contact stripes remained shiny (silvery) and basically unaffected by the oxidation. The remainder of the crystal, including the 2 μm regions between the GaAs stripes, is covered with the native oxide that formed by the method of the present invention. The native oxide was clear and transparent and uniform; it appeared blue in color because of optical effects and was 1000-1500 Å thick. The thickness of that portion of the upper confining that was converted to native oxide was also about 1000-5000 Å. Thus the thickness of the native oxide was substantially the same as or less than the corresponding thickness of the aluminum-bearing upper confining layer.

After the QWH was metallized with titanium-platinum-gold (Ti-Pt-Au) by conventional techniques, across its entire surface, it appeared as shown in FIG. 9(b). Before metallization occurred, the crystal was Zn diffused ($ZnAs_2$, 540° C., 25 min) to a shallow depth to improve the contact on the GaAs stripes. This procedure did not require any special masking. The crystal was thinned to about 100 μm and was metallized on the substrate side germanium-gold-nickel-gold (Ge-Au-Ni-Au), and cleaved into Fabry-Perot resonator strips that were then saw-cut into separate 10-stripe dies. These were attached to copper (Cu) using indium (In) on the stripe side for heat sinking and electrical test. Diode current versus voltage (I-V) characteristics had low series resistance (approximately 2 ohm, $\Omega$). This indicated that the GaAs contact layer was not affected by exposure to the oxidation method of the present invention. Additionally, the low leakage currents showed that the native oxide provided good current blocking.

Figure 10A:
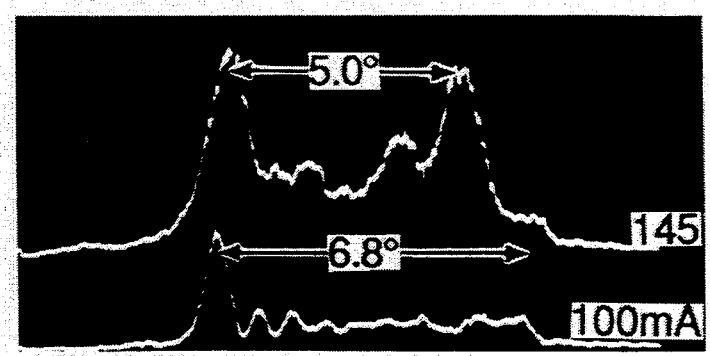
FIG. 10(a) shows the near-field (NF), and FIG. 10(b) the far-field (FF) emission patterns of the ten element multiple-stripe QWH laser array shown in FIG. 9 which had 5 micron (μm) wide emitters on 7 μm center-to-center spacings. The narrow peak with full angle at half power at 100 mA of 0.6° (FIG. 10(b)) indicated that the stripes were coupled.

The near-field and far-field radiation patterns of one of these devices are shown in FIG. 10. The device was mounted with the junction side upwards, and had a threshold of about 95 MA cw. FIG. 10(a) shows the near-field image as viewed with a Si metal oxide semiconductor (MOS) camera at a continuous wave (cw) laser current of 100 mA. Eight of the ten emitters of the array lased at this current. The other two stripes were visible on a more sensitive scale, but could not be shown without saturation of the camera by the eight more intense emitters. The near-field image, FIG. 10(a), demonstrates that effective current confinement is provided by the native-oxide-defined stripes.

Figure 10B:
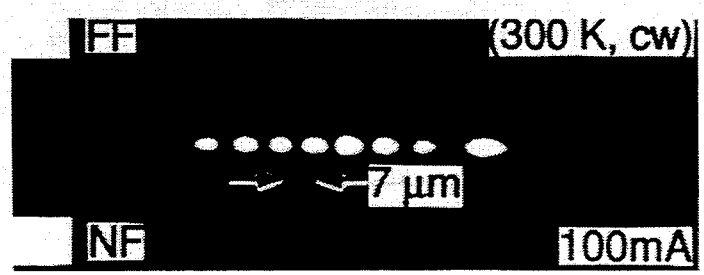

FIG. 10(b) shows the far-field pattern for the same device used, for FIG. 10(a). The radiation was collimated with a 25 mm f/0.95 lens and imaged on a linear chargecoupled device array. The twin-lobe pattern shown is characteristic of coupling with $\pi$-phase shift between emitters.

The lower trace of FIG. 10(b) shows the far-field pattern at 100 mA cw that corresponds to the near-field pattern shown in FIG. 10(a). The left peak was dominant because of non-uniform current injection and non-uniform operation near the lasing threshold. The peak separation of 6.8° agrees with the calculated value of 6.9° for the 7μm emitter spacing (with a wavelength of 8470 Å). The full angle at half-power (FAHP) of the left peak at 100 mA was 0.6°, which indicates that coupling across the full 68 μm aperture of the array (ten, 5 μm wide stripes on 7 μm centers) occurred. At higher currents, the carrier injection and the emitter intensity were more uniform, resulting in the more balanced twin-lobed far-field pattern shown at 145 mA in FIG. 10(b). Both lobes of the top trace have a FAHP of 1.1°, indicating weaker coupling of the array and/or coupling across a reduced aperture of about 44 μm (7 emitters). The decreased peak separation of 5.0° indicates a slightly smaller phase shift between emitters (the effect of transverse gain). An array of uncoupled 5-μm wide emitters would have a far-field divergence angle of 10° FAHP, roughly 10 times greater than the lobe widths of the coupled array demonstrated here.

Figure 11:
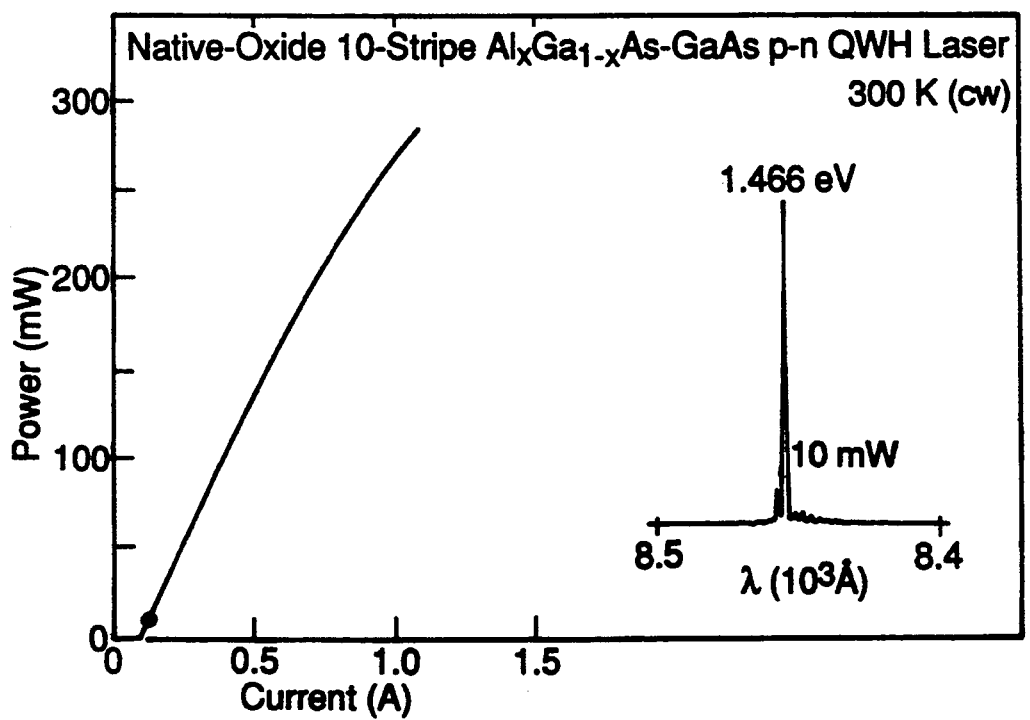
FIG. 11 shows the continuous-wave (cw) room-temperature (300° K.) laser operation of the ten emitter QWH coupled array of FIGS. 9 and 10 which had 5 μm wide stripes on 7 μm centers. The output power per facet approached 300 mW. In the inset, the spectral behavior (at 8457 Å and 1.466 eV) of the diode is shown at an output power of 10 mW (115 mA).

Because of the simple form of these coupled-stripe lasers and how well they are heat sunk via the GaAs contact stripes and the recessed native oxide, they were capable of considerable power output before failure. The power versus current behavior (continuous wave at 300° K.) of one of the diodes is shown in FIG. 11. The inset shows the output spectrum at 10 mW (one facet), which shifted from 8456 Å (1.466 eV) to a dominant mode at 8479 Å (1.462 eV) at higher drive currents and an output power of about 100 mW (single facet). This corresponds to a temperature increase of about 10° C. or less, when there is significant bandfilling.

Figure 12:
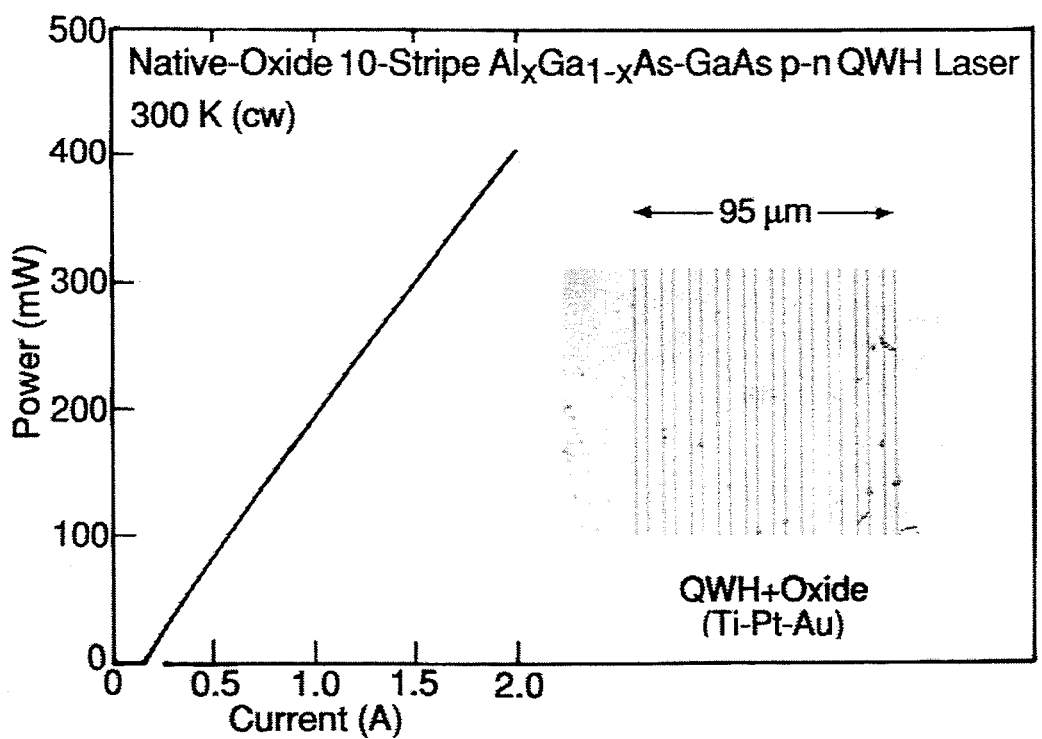
FIG. 12 shows the high power operation of a ten emitter native-oxide coupled-stripe $Al_xGa_{1-x}$GaAs QWH laser array. The stripe width was the same as that of the array of FIG. 11 (5 μm), but the stripes were located on 10 μm centers, as shown in the inset. Output powers exceeding 400 mW per facet were obtained.

Inasmuch as the gain-guided lasers of this Example couple over large distances, the emitter spacing can be further increased and the heat sinking further improved. FIG. 12 shows the power versus current behavior of a 10-stripe laser similar to that used in FIG. 11, but with stripe separation increased to 5 μm (see the FIG. 12 inset). Because of power supply limitations, the laser operation was terminated at 400 mW ( single facet; 2 amp. A).

EXAMPLE 4

NATIVE OXIDE MASKED IMPURITY-INDUCED LAYER DISORDERING OF $Al_xGa_{1-x}As$ QUANTUM WELL HETEROSTRUCTURES

This example investigated the masking capability of the native oxide that forms on $Al_xGa_{1-x}As$ (X>0.7) using the present invention. In particular this Example contrasted Zn diffusion and impurity-induced layer disordering (IILD) behavior between a bare $Al_xGa_{1-x}As$-GaAs superlattice (SL) or quantum well heterostructure (QWH) crystal, and a SL or QWH that was masked by a native oxide formed by the method of the present invention. In the latter case (native oxide masked) the quantum well (QW) and superlattice (SL) layers were shown to be preserved.

The superlattice (SL) and quantum well heterostructure (QWH) crystals used in this Example were grown on (100) GaAs substrates by metalorganic chemical vapor deposition (MOCVD) as described in the Dupuis, et al. reference cited in Example 1. In the case of the SL crystal (crystal #1), a GaAs buffer layer was grown, followed by an undoped $Al_{0.8}Ga_{0.2}As$ lower confining layer (the thickness of which was approximately 0.1 μm). Then the SL, consisting of 40 GaAs wells ($L_z$ of about 110 Å) and 41 $Al_{0.4}Ga_{0.6}As$ barriers ($L_B$ of about 150 Å), was grown. The total SL thickness was approximately 1.05 μm. Lastly, a 1000 Å $Al_{0.8}Ga_{0.2}As$ upper confining layer was grown on top of the SL. The structure was then capped with a 3000 Å GaAs layer.

In the case of QWH crystal, the first part of the MOCVD QWH (Crystal #2) was an n-type GaAs buffer layer (about 0.5 μ thick), which was followed by an n-type $Al_{0.25}Ga_{0.75}As$ intermediate layer. An n-type $Al_{0.8}Ga_{0.2}As$ lower confining layer was grown next. This was followed by the QWH active region, which was a $Al_{0.06}Ga_{0.94}As$ (QW) quantum well about 200 Å thick, sandwiched by two undoped $Al_{0.25}Ga_{0.75}As$ waveguide (WG) layers of about 1000 Å. Finally a p-type $Al_{0.8}Ga_{0.2}As$ upper confining layer was grown to a thickness of about 9000 Å) on top of the active region. The entire QWH, useful in laser diode construction, was capped by a heavily doped p-type GaAs contact layer having a thickness of about 800 Å.

The GaAs cap layer on both the SL and the QWH, was removed to expose the upper AlGaAs confining layer (x of about 0.8) to the oxidization method of the present invention. The presence of Ga in the oxidized layer and at the native oxide-semiconductor interface did not adversely affect the structure of the native oxide that formed because the oxygenated gallium and aluminum compounds form structural isomorphs having similar crystalline form, and $Al_2O_3$ and $Ga_2O_3$ form a solid solution over the entire compositional range represented by the upper confining layers of the SL and QWH. The $Al_xGa_{1-x}As$ oxidation was accomplished in accord with the present invention by heating the samples at 400° C. for 3 hours in an $H_2O$ vapor atmosphere obtained by passing $N_2$ carrier gas (with a flow rate of about 1.5 scfh) through an $H_2O$ bubbler maintained at 95° C.

Figure 13:
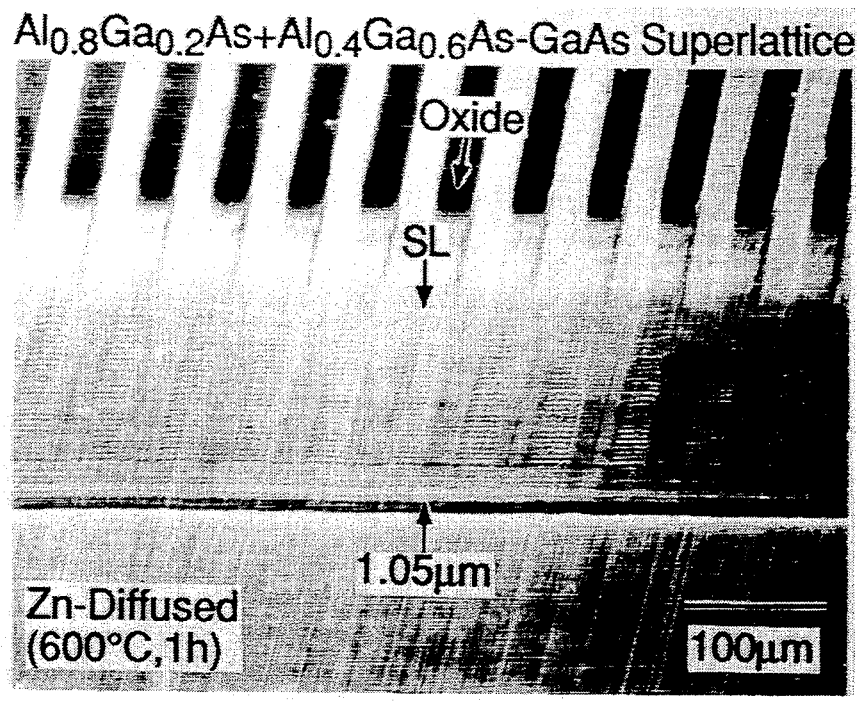
FIG. 13 shows a shallow-angle beveled cross section, after zinc (Zn) diffusion, of a 1.05 μm $Al_xGa_{1-x}$As-GaAs superlattice with 20 μm masking stripes, (top) on the crystal surface. The masking stripes were comprised of a native oxide as formed in accordance with the present invention. The lower part of the slant cross section shows regions, not masked by the oxide, where the superlattice was disordered; the disordered regions are shown as alternating with regions that were masked by the native oxide and where the superlattice was intact.

In order to effect selective Zn diffusion and layer disordering in the SL sample (Crystal #1), a photoresist stripe pattern (20 μm stripes on 50 μm centers) was defined on top of the native oxide thus formed. Using a $NH_4F$:HF (7:1) buffered HF solution, the native oxide was selectively removed in a stripe pattern, as shown in FIG. 13. The sample was then cleaned in an $NH_4OH$ solution and immediately sealed in an ampoule with a piece of $ZnAs_2$ (10 mg) for the Zn diffusion (at 600° C. for 1 hour). A shallow-angle lap of the SL sample after the diffusion is shown in FIG. 13. The native oxide mask, formed in accord with the practice of the present invention, which is indicated by the downward arrow labelled "oxide" in FIG. 13, masked the underlying $Al_{0.4}Ga_{0.6}As$-GaAs SL from the diffusion of Zn, and from layer intermixing that occurred in areas where the oxide had been removed. The 40 period SL (having a total thickness of about 1.05 μm) was seen to be clearly intact beneath the native oxide mask, while intermixed elsewhere.

In the case of the QWH wafer (Crystal #2), two samples were sealed in an ampoule with $ZnAs_2$ for simultaneous heating and for IILD diffusion (at 575° C. for 1 hour). One sample had a native oxide masking layer on it as formed by the method of the present invention, while the other sample was the QWH with simply the GaAs cap layer removed. Similar to the selective Zn-IILD of the SL of FIG. 13, the QWH sample having the oxide as formed according to the present invention, did not disorder. In comparison, layer intermixing occurred for the QWH comparison sample which did not have the native oxide masking layer on it; (as determined shown by photoluminescence measurements).

Figure 14:
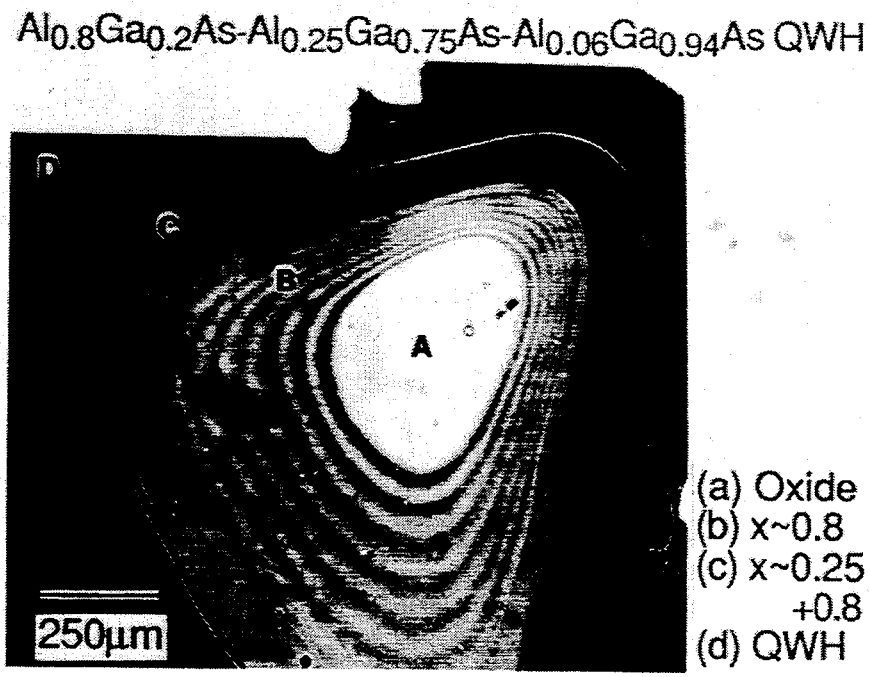
FIG. 14 shows the cleaved section of a (100) $Al_xGa_{1-x}$As-$Al_yGa_{1-y}$As-$Al_zGa_{1-z}$As QWH (x of about 0.8, y of about 0.25, z of about 0.06) platelet sample. Native oxide formed according to the process of the present invention, was revealed by removing the substrate and etching a tapered hole through all the layers (stopping at the oxide). The native oxide layer, indicated as Region A, transmitted light and was clear enough to show specks of dirt that were on it. The upper confining layer is indicated as Region B; the QWH waveguide and upper and lower confining layers are indicated as Region C. The entire QWH is indicated as Region D.

The QWH samples, both masked and not-masked, were prepared for photoluminescence measurements by first lapping and polishing the crystals, using conventional techniques, to a thickness of approximately 2 mils. Next, the remaining substrate and GaAs buffer material were removed by wet chemical etching in $H_2SO_4$:$H_2O_2$:$H_2O$ (4:1:1), followed by selective etching. A photomicrograph of an oxide-masked portion of the QWH (Crystal #2) is shown in FIG. 14. The photomicrograph of FIG. 14 was taken with light that was transmitted through the thinned QWH crystal at a spot which was "rough etched" all the way to the oxide layer, thus revealing features of the QWH and of the native oxide that was produced by the method of the present invention.

Referring to FIG. 14, Region A of the photomicrograph showed the native oxide to be of excellent quality, i.e., it was clear and transparent and similar to the oxide that was produced in the oxidation of the AlAs-GaAs SL crystals of Example 1. Indeed, the oxide was so clear that specks of dirt on the surface of the oxide were easily seen. The remaining regions showed the various layers of the QWH material deeper into the crystal. At Region B, the oxide plus the upper QWH confining layer ($Al_{0.8}Ga_{0.2}As$) were seen and were yellow in color, due to optical effects. In Region C, the waveguide plus the QW active region, as well as the upper and lower confining layers, were seen as orange in color, also due to optical effects. Finally, in Region D, the entire thickness of the QWH was seen as red in color (again due to optical effects). Some of the buffer layer (where X was about 0.25) that was not completely removed at the crystal edge was also seen in Region D.

Figure 15:
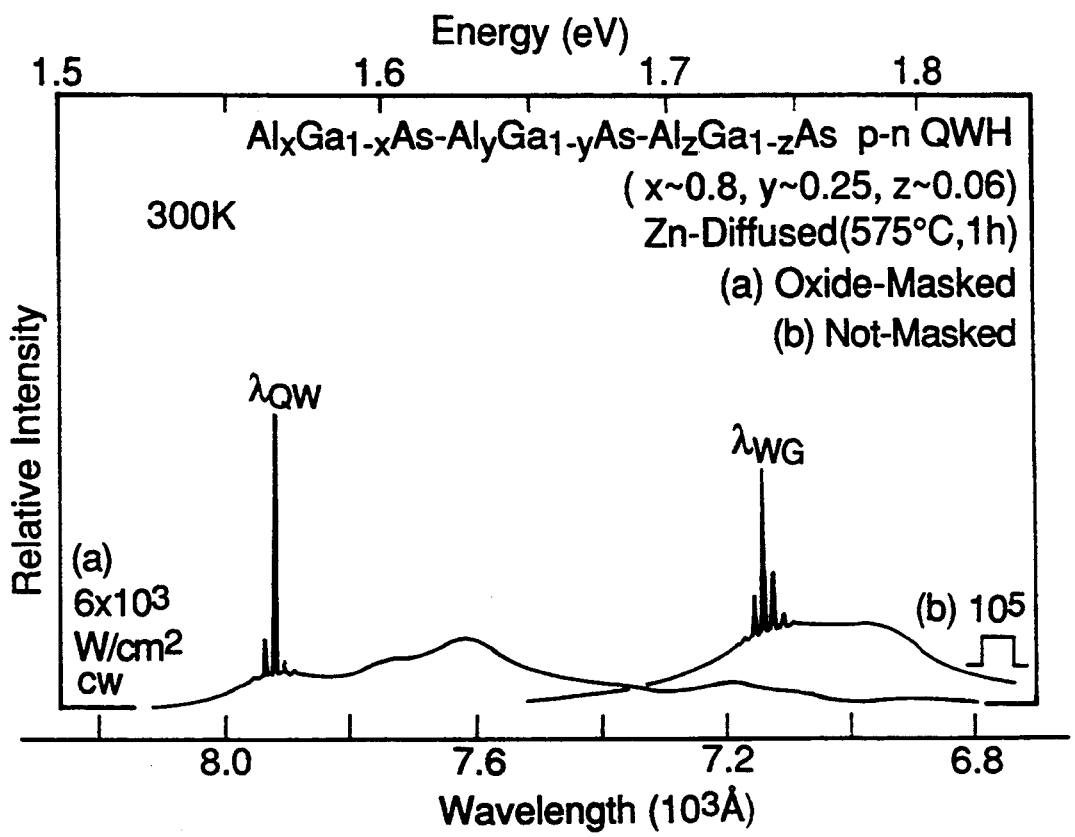
FIG. 15(a) shows the photopumped continuous wave (cw) room-temperature (300° K.) laser operation of the annealed QWH of FIG. 14 which incorporated a native oxide as formed by the method of the present invention.
FIG. 15(b) shows, in comparison, the pulsed-excited laser operation of a non-masked bare sample as modified by impurity-induced layer disordering (IILD). Both samples had been simultaneously annealed at 575° C. for 1 hour in a Zn diffusion ampoule.

To further examine the capability of the native oxide that is produced by the present invention to mask the crystal from Zn-IILD, cleaved samples were examined via photoluminescence (PL). Native-oxide masked and non-masked samples that had been exposed simultaneously to the Zn and As ambient at 575° C. for 1 hour (the Zn-IILD) were heat sunk in copper under diamond for photopumping with an $Ar^+$ laser (5145 Å). The resultant photoluminescence spectra (laser operation) are shown in FIG. 15.

FIG. 15(a) shows that the lasing wavelength (continuous operation, 300° K.) for the native-oxide-masked samples occurred at 7992 Å (1.565 eV); while that for the pulse-excited non-masked comparison samples, FIG. 15(b) was shifted to 7140 Å (1.736 eV). The shift of approximately 170 meV in the laser operation of the non-masked QWH crystal (Zn-ILLD), FIG. 15(b), agreed with what was expected for a $Al_xGa_{1-x}As$ QW (x of about 0.06) intermixed into a bulk-crystal waveguide region (x of about 0.25). This indicated that the non-masked samples had been intermixed (with an energy shift of about 170 meV), while the native-oxide-masked samples, FIG. 15(a), were intact. Also, for the FIG. 15(a) samples, QW band-filling was evident, while for the IILD FIG. 15(b) samples, only bulk-crystal behavior was evident. Interestingly, photoexcitation of the native-oxide-masked (a) samples of FIG. 15(a) took place through the transparent oxide, indicating that the native oxide, formed by the Present method was of high quality.

EXAMPLE 5

LOW-THRESHOLD DISORDER-DEFINED NATIVE-OXIDE-DELINEATED BURIED-HETEROSTRUCTURE $Al_xGa_{1-x}As$-GaAs QUANTUM WELL LASERS

Impurity-induced layer disordering (IILD), such as described by W. D. Laidig, et al. in *Appl Phys. Lett.*, 38, 776 (1981) and D. G. Deppe, et al. in *J. Appl. Phys.*, 64, R93, (1988), has been employed to produce very high performance planar buried-heterostructure (BH) quantum well heterostructure (QWH) lasers such as described by D. G. Deppe, et al. in *J. Appl. Phys.*, 58, 4515 (1985). Various dopants and diffusion techniques have been employed to fabricate disorder-defined BH lasers, including: (1) Si solidsource diffusion, (2) Si implantation and annealing, (3) Ge diffusion from the vapor, (4) Zn diffusion from the vapor, (5) Si-O diffusion from Al-reduced $SiO_2$, (6) Si diffusion from Al-reduced Si/-$Si_3N_4$ via rapid-thermal annealing, and (7) Si diffusion from laser melted $Si_3N_4$. Many of these diffusion sources and techniques suffer from the fact that they form a very highly conductive layer at the crystal surface, possibly due to the formation of a dopant-crystal alloy. This conducting layer is a source of leakage, thus increasing laser threshold currents. Indeed, under certain conditions, the dopant-crystal alloying is so severe that a relatively deep proton implant is required to passivate the leakage regions and ensure low threshold operation.

This Example demonstrates a "self-aligned" process, in which the crystal surfaces were converted to a high-quality, current-blocking native oxide by the method of the instant invention. The oxide thus formed was found to passivate the surface, thus reducing leakage currents and yielding an improved form of low threshold disorder-defined. BH $Al_xGa_{1-x}As$-GaAs quantum well heterostructure laser.

The QWH laser crystal employed in this Example was grown by metalorganic chemical vapor deposition (MOCVD), as described in the Dupuis, et al. reference cited in Example 1, on an n-the substrate. The growth began with n-type buffer layers of GaAs having a thickness of about 0.5 μm and $Al_{0.25}Ga_{0.75}As$ having a thickness of about 1 μm. This was followed by the growth of: an approximately 1.1 μm thick $Al_{0.77}Ga_{0.23}As$ n-type lower confining layer; an approximately 2000 Å thick $Al_{0.25}Ga_{0.75}As$ undoped waveguide region; an approximately 1.1 μm (11,000 Å) thick $Al_{0.8}Ga_{0.2}As$ p-type upper confining layer; and an approximately 0.1 μm thick p-type GaAs cap. In the center of the waveguide, a $Al_{0.06}Ga_{0.94}As$ quantum well, undoped, having a thickness of about 200 Å was grown.

The laser diode fabrication process began with a shallow Zn diffusion over the entire surface, in an evacuated quartz ampoule at 540° C. for 30 min. The shallow p+ layer formed by the diffusion helped control lateral Si diffusion at the crystal surface (under the masked regions) in later processing steps. After Zn diffusion, the crystal was encapsulated with about 1000 Å of $Si_3N_4$ which was deposited by conventional chemical vapor deposition (CVD) at 720° C. The $Si_3N_4$ was patterned with photoresist and etched with a $CF_4$ plasma into two stripe widths: 4 μm and 6 μm. The photoresist was removed, with the remaining $Si_3N_4$ stripes serving as masks during chemical etching, with $H_2SO_4$:$H_2O_2$:$H_2O$ (1:8:80), of the GaAs contact layer. This etching left the high-gap $Al_{0.8}Ga_{0.2}As$ upper confining layer exposed.

Following stripe delineation, CVD techniques were used to deposit an approximately 300 Å thick Si layer (CVD at 550° C.) and an approximately 1700 Å thick $SiO_2$ cap layer (CVD at 400° C.). The crystal was then sealed in an evacuated quartz ampoule and annealed with excess As at 850° C. for 6.5 hours. The high temperature anneal resulted in Si diffusion and IILD outside of the GaAs contact stripes.

The encapsulant was removed by etching with a $CF_4$ plasma, and the crystal was oxidized according to the present invention as follows: The crystal was placed in an open-tube furnace (supplied with a $N_2$ carrier gas bubbled through $H_2O$ at 95° C.) at 400° C. for 3 hours. This resulted in the conversion of approximately 2000 Å of the exposed upper confining layer at the edge and beyond the GaAs contact stripe regions. The thickness of oxide layer formed was substantially the same as the thickness of that portion of the upper confining layer that was converted. No oxide was formed on the GaAs contact stripes due to the selectively of the oxidation process. The formation of native oxide only in areas of high aluminum composition resulted in contact stripes that were self-aligned. Following oxidation by the method of the invention, the wafer was sealed in an ampoule with a $ZnAs_2$ source, and was annealed at 540° C. for 30 min to form, only in the contact areas, a shallow, heavily doped p-type region. Samples were then conventionally lapped to a thickness of about 5 mils, polished, metallized with titanium-gold (Ti-Au) on the p-type side, metallized with germanium-nickel-gold (Ge-Ni-Au) on the n-type side; the samples were then cleaved into bars approximately 250 μm in length.

Figure 16:
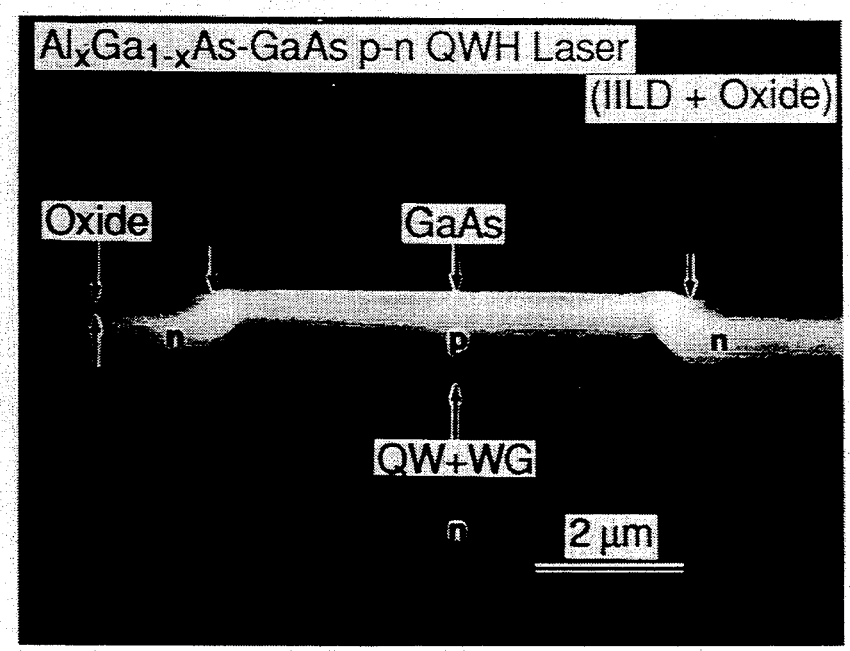
FIG. 16 shows a scanning electron microscope (SEM) image (using a stain) of a buried-heterostructure (BH) $Al_xGa_{1-x}$As-GaAs QWH laser after Si diffusion at 850° C. for 6.5 hours and impurity-induced layer disordering on the left and right sides (indicated by the letter "n"). Oxidation according to the present invention, at 400° C. and 3 hours in an atmosphere of nitrogen and water vapor, of the top confining layer was then performed. The Si diffusion undercut the edge of the GaAs cap, which resulted in a contact region of about 5.5 μm and an active region of about 7 μm (for a 6 μm masking stripe). The formation of a native oxide by the method of the invention was at the surface of the exposed high-gap $Al_xGa_{1-x}$As confining layer, and extended completely to the edge of the GaAs cap (as indicated by the two unmarked downward arrows).

FIG. 16 shows a scanning electron microscope (SEM) image of a stained cross section of a 6-μm-stripe BH laser structure after the Si-IILD and the oxidation method of the present invention that resulted in self-aligned contact stripes. Reference to FIG. 16 shows that the impurity-induced layer disordering intermixed the waveguide region with the surrounding confining layers (outside of the GaAs contact region) and provided current confining p-n junctions. Lateral diffusion resulted in a contact region of approximately 5.5 μm and an active region having a width of approximately 7 μm. Similarly, for diodes processed with 4 μm stripes, the contact region was about 2.5 μm with an approximately 3 μm wide active region. Oxidation by the method of the present invention, of the high-gap $Al_x$-$Ga_{10x}As$ regions outside of the GaAs contact stripe resulted in the formation of a high-quality current-blocking native oxide at the crystal surface. The oxide grew all the way to the edge of the GaAs contact stripe, as indicated in FIG. 16 by the unmarked vertical arrows at the "notch" at the stripe edges. This resulted in the self-aligned passivation of areas having the potential for leakage by conversion of these areas to the native oxide. The native oxide was actually thicker than it appeared in FIG. 16 since the stain, $K_3Fe(CN)_6$-KOH, that was employed to resolve the heterolayers also etched the oxide.

Figure 17:
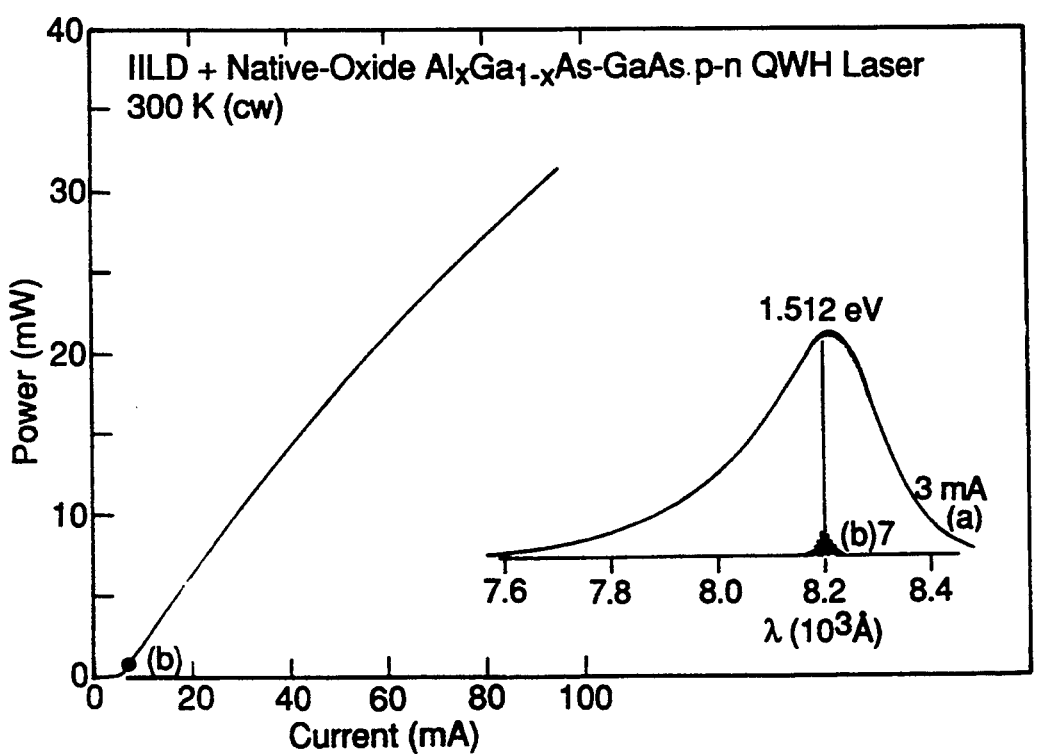
FIG. 17 shows the continuous wave (cw) room-temperature, (300° K.) output (single facet) power versus current (L-I) curve and spectra for an IILD QWH laser diode, having a native oxide layer as formed by the method of the present invention. The laser diode had a 3 μm-wide active region (as compared to the 7 μm wide active region of the laser of FIG. 16). The laser threshold (250 μm long diode) was 5 mA, with single mode behavior well developed at 7 mA (wavelength of about 8198 Å). Spectral narrowing and "ringing" began at about 2 mA and caused the fuzzy appearance at the top of curve (a) of the inset (3 mA).

The laser diodes fabricated using native oxide as formed by the present invention typically exhibited pulsed thresholds between 3.5 mA and 6 mA (for the 3 μm stripe) and 7.5 and 9.5 mA (for the 7 μm stripe), as tested in a probe station. FIG. 17 shows the continuous wave (cw) light power versus current (L-I) curve of a 3 μm stripe diode that was mounted p-side down on an indium-coated (In-coated) copper per (Cu) heatsink.

The room temperature (300° K.) continuous wave (cw)) threshold was 5 mA for this device (uncoated facets). Spectral data indicated that the diode first began to narrow spectrally and "ring" at about 2 mA, which accords with good carrier and optical confinement and low edge leakage. Lasing occurred at 8198 Å, with single-longitudinal mode operation well developed at 7 mA and extending up to at least 20 mA. The laser diode exhibited an external differential quantum efficiency of 53% (up to about 10 mW) and an output power of greater than 31 mW/facet before catastrophic damage occurred. At powers greater than 10 mW, the increasing curvature of the L-I plot indicated that heating effects became significant. However, this phenomenon was due to the relatively high forward resistance of the diodes (R of about 20 Ω), and not to the inability of the native oxide to dissipate heat. Thus the native oxide formed by the method of the instant invention acted as an excellent current-blocking layer for stripe-geometry laser diode operation. These diodes exhibited sharp turn-ons and no observable leakage through the oxide.

Unmounted, the laser diode of FIG. 17 exhibited a pulsed threshold of 4.5 mA. Other diodes also exhibited a very small increase (usually less than 0.5 mA) in pulsed (unmounted) versus continuous wave (mounted) laser thresholds. These increases were much smaller than those typically observed for other fabrication processes. This was attributed to better thermal contact between the metallization and the oxide formed by the invention, as well as better oxide heat conduction, over that for other masking encapsulants. In addition, the formation of the native oxide by the invention "consumed" the highly doped surface layer. Thus, the high-gap shunt junctions had lower doping, and thus lower capacitance. Compared to continuous wave operation, high shunt junction capacitance causes the leading edge of a pulsed current to divide differently between the quantum well junction and the shunt IILD junction, which leads to a significant difference in pulsed versus continuous wave laser thresholds. Thus diodes with lower shunt capacitances will have more similar pulsed and continuous wave laser thresholds than those with high capacitances.

Figure 18A:
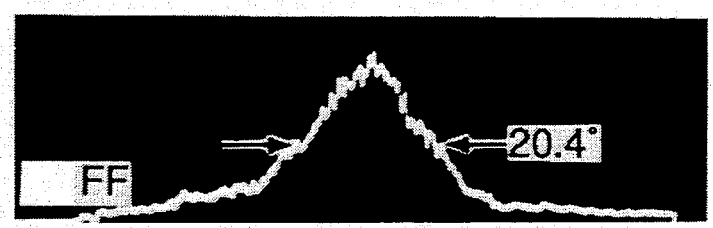
FIG. 18 shows the near field (NF) and far-field (FF) emission patterns of a 3-μm-wide active region IILD QWH laser, that was delineated by native oxides as formed by the present invention, under continuous wave (cw) excitation of 12 mA. The near-field (NF) pattern indicated as 18(a), had a full width at half maximum power of about 3.4 μm. The far field (FF) pattern, indicated as 18(b), had a full angle at half power of 20.4°, and was diffraction limited.
Figure 18B:
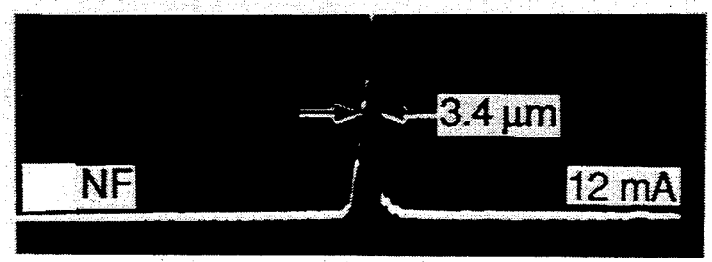

The field patterns of a 3-$\mu$m stripe laser are shown in FIG. 18 for continuous wave operation at 12 mA. The nearfield pattern, FIG. 18(a), had a full width at half maximum of about 3.4 $\mu$m, which agreed closely with an active region having a width of about 3 $\mu$m, as observed in SEM micrographs. The far-field pattern, FIG. 18(b) had a full angle at half maximum of about 20.4°, which corresponded to the diffraction limited operation of a 3 $\mu$m stripe.

EXAMPLE 6

NATIVE OXIDE STABILIZATION OF AlAs-GaAs HETEROSTRUCTURES

This Example compares the high quality and stabilizing nature of the native oxide formed in accordance with the present invention with the inferior quality and destructive nature of oxides that form at temperatures lower than that prescribed in the practice of the instant invention. In particular, this Example compares the quality of the native oxide that forms on exposure to water vapor and nitrogen gas and a temperature of 400° C. after 3 hours, with the oxide(s) that form by exposure to atmospheric moisture and temperature, which conditions are representative of oxide "formation under a temperature of 375° C.

The crystals used in this experiment were grown by metalorganic chemical vapor deposition (MOCVD) on (100) n-type GaAs substrates in an EMCORE GS 3000 DFM reactor at 760° C. The crystal growth pressure, Group V/Group III ratio, and growth rate were 100 Torr, 60, and about 1000 Å/min, respectively. An undoped GaAs layer approximately 0.5 $\mu$m thick was grown first, followed by an nominally undoped AlAs layer about 0.1 $\mu$m thick. The crystal was then cleaved in two. One half of the cleaved crystal was exposed to atmospheric conditions at room temperature (Sample a). The other half was oxidized, according to the method of the present invention, at a temperature of 400° C. for 3 hours in an $H_2O$ vapor atmosphere obtained by passing $N_2$ carrier gas (having a flow rate of about 1.5 scfh) through an $H_2O$ bubbler maintained at 95° C. (Sample b). Sample (b) was then exposed to atmospheric conditions identical to those for Sample (a).

Figure 19A:
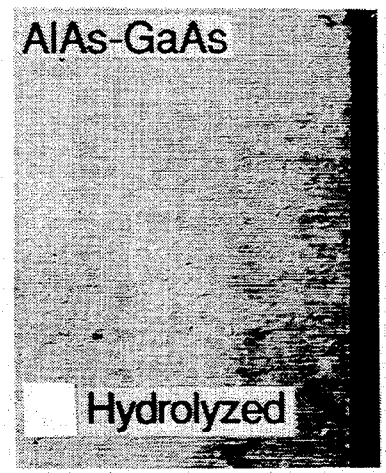
FIG. 19 shows a Nomarski image photograph taken after 100 days of an AlAs-GaAs heterostructure which had undergone oxidation at atmospheric conditions, FIG. 19(a), and which had a native oxide layer as formed by the present invention, FIG. 19(b). The atmospherically oxidized Sample 19(a) shows the characteristic roughening of atmospheric hydrolysis, while Sample 19(b) oxidized by the method of the invention was covered with a smooth "blue" oxide and was unaffected by the aging process.
Figure 19B:
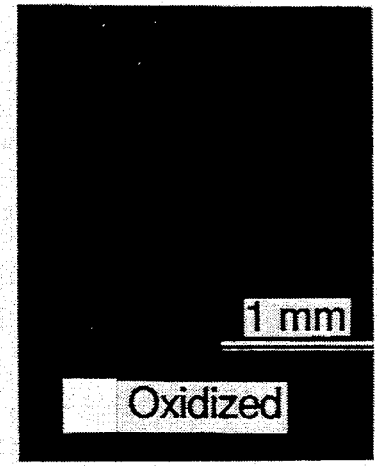

Within hours after exposure, the Sample (a) crystal began to degrade in color to a yellowish brown, while the Sample (b) crystal maintained a uniform blue appearance (the oxide was clear and transparent, the blue color was a result of optical effects). FIG. 19 is a Nomarski image photograph of the surfaces of crystal Samples (a) and (b) after, in both cases, atmospheric exposure for 100 days. The surface of sample (a) was clearly "rougher" than that of Sample (b). Several days after the 100 day aging process, Sample (a) showed signs of nonuniformity around the edges of the crystal, while Sample (b) remained unchanged. The oxidized surface of Sample (b) was smoother than the surface of Sample (a), and the cleaved edge of Sample (b) was intact whereas the edge of Sample (a) showed signs of destructive attack (as indicated by toughening).

Figure 20A:
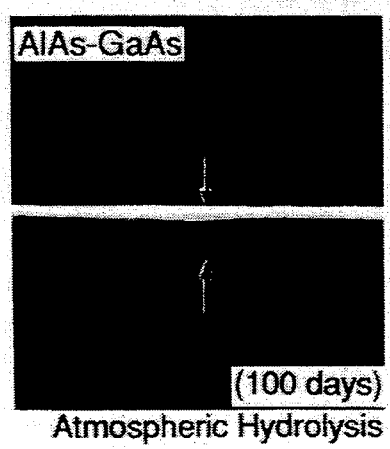
FIG. 20(a) is a scanning electron microscope (SEM) image (unstained cross section) of Sample (a) of FIG. 19 after being cleaved and aged (for 100 days).
Figure 20B:
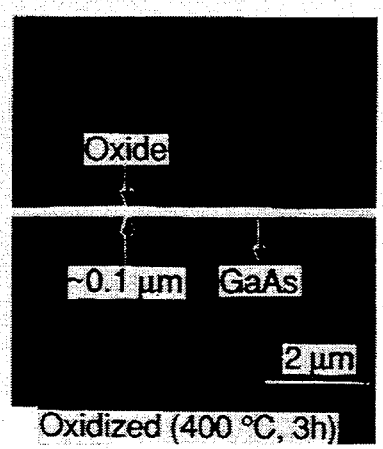
FIG. 20(b) is a SEM image of Sample (b) of FIG. 19 after being cleaved and aged (for 100 days). Sample (a) had been chemically attacked to a depth of 1 μm (indicated by vertical arrows) and was striated in appearance. In contrast, Sample (b) remained smooth under the native oxide layer which was less than 0.1 μm thick. This thickness was less than the thickness of that portion of heterostructure which had converted to the oxide.

FIG. 20 is a scanning electron microscope (SEM) image of the edges of Samples (a) and (b). The edges were unstained, cleaved cross sections that had been aged 100 days. Sample (a) showed signs of chemical attack into the crystal, which depth was well beyond the approximately 0.1 $\mu$m thick AlAs top layer of the As-grown crystal. In contrast, the cross section of the Sample (b) exhibited a native oxide layer that was substantially the same thickness as the AlAs top layer of the As-grown crystal, the thickness of the native oxide being approximately 0.1 $\mu$m thick; the native oxide also showed no perceptible sign of degradation. The cross section of Sample (a) also appeared to be nonuniformly etched. This was surprising in that the sample was not stained to high-light this layer.

Figure 21:
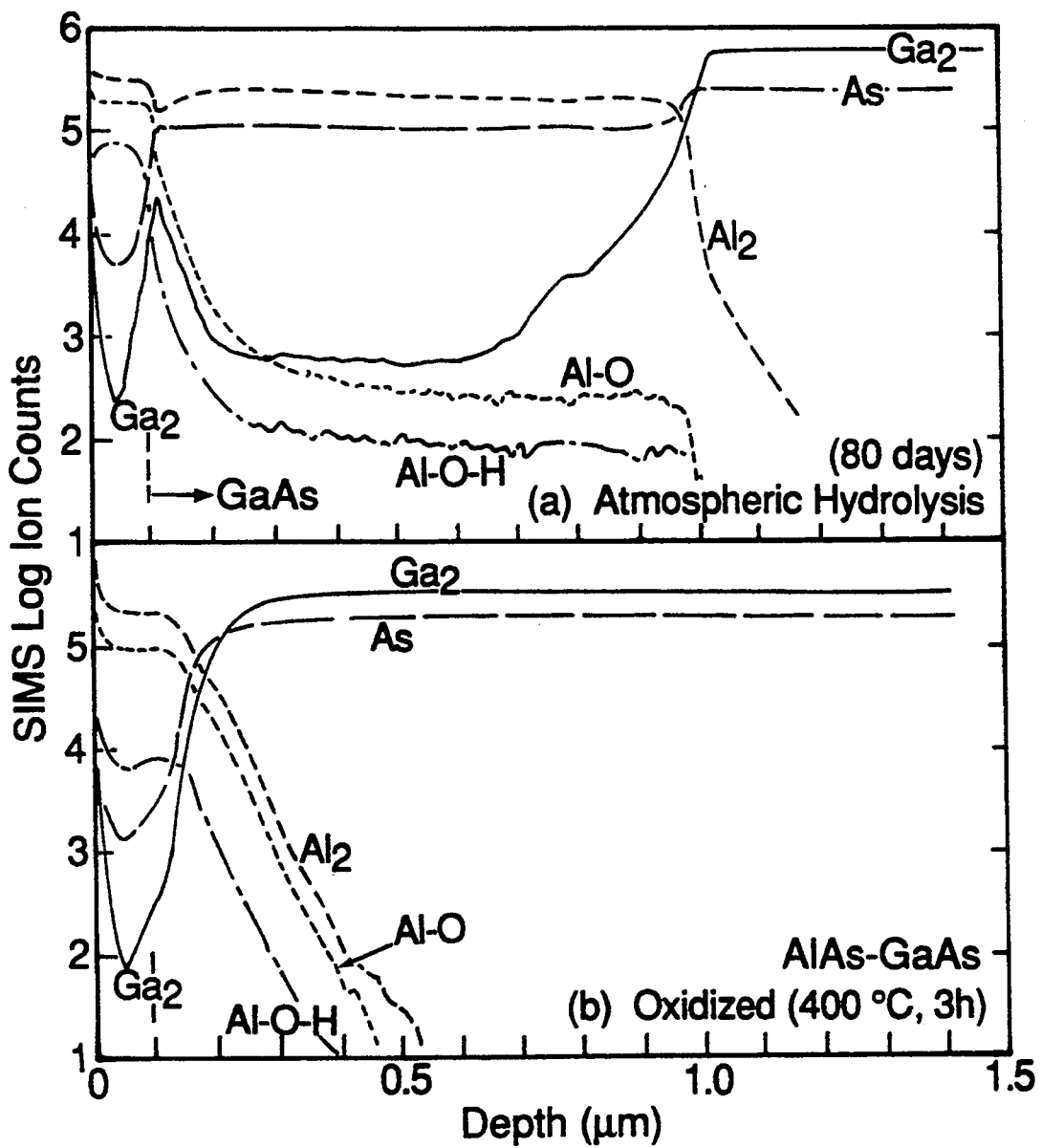
FIGS. 21(a and b) shows secondary ion mass spectrometer (SIMS) profiles after Sample (a) and (b) of FIG. 19 were aged for 80 days. In accord with the SEM images of FIG. 20, a Ga depletion approximately 1 μm deep in Sample (a) was not evident in Sample (b). Also in accord with FIG. 20.

The results of secondary ion mass spectrometer (SIMS) analysis on Samples (a) and (b) taken after 80 days are shown in FIG. 21. Both Samples (a) and (b) had large oxygen and hydrogen signals (indicated by Al-O-H ion count) in the top 0.1 $\mu$m of thickness. More unusual was that Sample (a) showed a significant Al-O-H ion count as deep as about 1.0 $\mu$m into the crystal itself. This was in sharp contrast to the Al-O-H signal in the Sample (b), where the ion count for Al-O-H decreased steadily after approximately the first 0.1 $\mu$m of thickness, which represents the layer formed by the native oxide. The Al-O ion count tracked the Al-O-H signal in both samples. Another striking difference in the two crystals was the Ga depletion that was evident in the top 1 $\mu$m of Sample (a), which indicated that chemical reactions and degradation of the crystal was occurring. The Ga signal of Sample (a) increased at the AlAs-GaAs interface, that is, at approximately 0.1 μm, and then decreased again at the surface; however, no such "spike" in the Ga signal was observed in the case of the Sample (b) and Sample (b) did not show signs of any such chemical reactions or degradation; these results are in accord with the SEM images of FIG. 20 and demonstrate that the native oxide that formed from approximately the first 0.1 μm of Sample (b) by the method of the present invention was stabilizing in nature.

SIMS analysis also showed a dip in the Al-O-H signal in about the first 0.1 μm of Sample (b) which dip was not present in Sample (a). Transmission electron microscope images of similarly oxidized heterostructures indicated that there was a slight contraction of the native oxide layer to roughly 60% to 70% of original thickness of the AlAs top layer. This contraction can be explained by the fact that the molar volume of AlO(OH), which is one of the possible products of an Al-H$_2$O reaction, and does not deleteriously effect oxide quality when present in modest quantities, is 27% less than the molar volume of AlAs. (The molar volumes of the anhydrous α and phases of Al$_2$O$_3$ are approximately equal to that of AlAs which indicates formation of one or both probably α-Al$_2$O$_3$ as a major component of the native oxide of the instant invention). The contraction of the AlAs layer to about 0.06 μm to 0.07 μm (as indicated by the dip in the Al-O-H signal) suggests that AlO(OH) is either an intermediate or, less likely, an end product of the oxidation method of the present invention. More likely, the contraction in thickness is caused by the loss of arsenic. Several reactions involved in the AlAs oxidation are possible:

$$AlAs + 3H_2O \rightarrow Al(OH)_3 + AsH_3 \uparrow \quad (1)$$

$$AlAs + 2H_2O \rightarrow AlO(OH) + AsH_3 \uparrow \quad (2)$$

$$2AlAs + 3H_2O \rightarrow Al_2O_3 + 2AsH_3 \uparrow \quad (3)$$

Reactions involving the formation of As$_2$O$_3$ are also possible but are less likely given the extent of As depletion (as shown in FIG. 21) in the AlAs layers in both the Samples (a) and (b).

Reaction (1) probably occurs in Sample (a) and is likely responsible for the inferior quality of the oxide(s) produced; the standard heat of formation of Al(OH)$_3$ being greater than that of either α-Al$_2$O$_3$, γ-Al$_2$O$_3$ or AlO(OH) at 300° K. This is also in agreement with the phase diagrams showing the most thermodynamically stable phase at 300° K. under atmospheric pressure. See, E. M. Levin, et al. *Phase Diagrams For Ceramists* (The American Ceramics Society, Columbus, Ohio) FIG. 2008, P. 551 (1964); FIG. 1927, P. 527 (1964) and FIG. 4984, P. 426 (1975) which figures are incorporated by reference herein.

As depletion that occurs in roughly the first 0.1 μm of sample (b), as shown in FIG. 21, was two orders of magnitude greater than that for Sample (a). This suggests that a second reaction in the AlAs layer of Sample (b) takes place which liberates still more As (as the volatile product AsH$_3$) thus increasing contraction of the native oxide layer. The possible reaction may be:

$$AlO(OH) + AlAs + H_2O \rightarrow Al_2O_3 + AsH_3 \uparrow. \quad (4)$$

The greater As depletion in the AlAs layer of Sample (b), as compared to Sample (a), indicates that As may play a significant role in the formation of the stable native oxide of the invention and may, in fact, catalyze the reaction of hydroxyl (OH$^-$) groups in AlAs. The presence of hydroxyl groups are thought to be responsible for the instability of the oxides of Sample (a) and for the inadequacies of oxides from prior art thermal oxidation techniques.

As to oxygenated gallium compounds, gallium trihydroxide, Ga(OH)$_3$, is the most likely Ga-O-H compound formed at room temperature and atmospheric pressure. Gallium hydroxyoxide, GaO(OH), is the most likely form at about 100° C. and gallium oxide, β-Ga$_2$O$_3$, the stablest form, at about 400° C. Both Ga(OH)$_3$ and GaO(OH) have inadequate physicality for semiconductor purposes and also would cause an expansion in oxide thickness when present. It is believed that Ga(OH)$_3$ and GaO(OH) are formed at temperatures under the 375° C. prescribed by the practice of the present invention and thus would likely be formed in undesirable quantities by thermal oxidation techniques of the prior art. Because Ga(OH)$_3$ is a much stronger acid than is Al(OH)$_3$, Al(OH)$_3$ being amphiprotic, there is also a strong likelihood that a reaction between these two hydroxides occurs thus further exacerbating the deleterious effects these materials have on semiconductor structure. Since (when in hydrous form) both are also electrolytes, the presence of light may contribute to the reaction.

While there are indications that Ga-O-H and Al-O-H compounds are also present in the native oxide of the present invention it is clear that even if present, they did not attack the crystal of Sample (b) as in the case of the Sample (a). The reduction of these particular hydroxides at higher temperatures used in forming the native oxide of the present invention (at greater than about 375° C.), apparently stabilizes the Al-H$_2$O and Ga-H$_2$O reactions, thus inhibiting the destructive chemical reactions attendant lower temperature oxidation.

EXAMPLE 7

RATE OF NATIVE OXIDE FORMATION BY RAPID THERMAL PROCESSING

A furnace at 650° C. was provided with a water vapor environment obtained by passing N$_2$ gas through an H$_2$O bubbler at 95°-105° C.; nitrogen gas flow rate was approximately 1.4 scfh.

In order to minimize thermal mass effects, the quartz boat used to carry the samples of this example remained in the furnace until the samples were ready to be oxidized. The samples utilized were a crystal having an Al$_x$Ga$_{1-x}$As layer, where x was between about 0.8 to about 0.9.

To oxidize the crystals, the quartz boat was removed from the furnace and a sample was loaded onto the boat. The sample and boat were then placed into the furnace. Oxidation time periods of between about 15 seconds to about 10 minutes were employed for separate samples. At the end of each oxidation the sample used was quickly removed from the furnace.

For each sample, the rate of native oxide formation was observed to be about 0.1 μm (about 1000 Å) of native oxide formed for about every 15 seconds of oxidation time using the rapid thermal processing of the present invention.

EXAMPLE 8

INDEX OF REFRACTION MEASUREMENTS

A native oxide layer was formed from four samples of $Al_{0.8}Ga_{0.1}As$ (each such layer was about 0.4 μm thick) overlaid on a GaAs substrate. The samples, Samples 1-4, each had a GaAs cap (about 0.1 μm thick) which was removed with an $H_2SO_4:H_2O_2:H_2O$ (1:8:80) solution; the samples were immediately oxidized in accordance with the procedure used in Example 7. Oxidation times for Samples 1-4 were 1, 2, 4 and 10 minutes, respectively.

Ellipsometer measurements, using conventional equipment and a wavelength of λ=6328 Å, determined the thickness and index of refraction of the oxide layers thus formed in accordance with the present invention. The results are shown in Table 2, below:

TABLE 2

| Sample | Oxidation Time (min.) | Thickness (μm) | Index of Refraction (n) |
|---|---|---|---|
| 1 | 1 | 0.38 | 1.57 |
| 2 | 2 | 0.41 | 1.54 |
| 3 | 4 | 0.39 | 1.55 |
| 4 | 10* | — | — |

*Data for the 10 minute oxidation time are not presented due to significant scattering of the probe beam which reduced the accuracy of the measurements.

As apparent from Table 2, the $Al_{0.8}Ga_{0.1}As$ layers Samples 1-3 were substantially completely oxidized and that the thickness of the resulting native oxides were substantially the same as or less than the thickness of the $Al_{0.8}Ga_{0.1}As$ layers that converted. The indices of refraction of the native oxides thus formed ranged from 1.54-1.57, which indicated that the native oxide thus formed on each sample was formed primarily of dehydrated aluminum compounds.

What is claimed is:

1. A semiconductor laser which comprises:
   a semiconductor substrate layer;
   a first confining layer on said substrate layer;
   an active region on said first confining layer;
   a second confining layer on said active region, said second confining layer comprised of a first aluminum-bearing Group III-V semiconductor material;
   a current blocking layer on said second confining layer, said current blocking layer comprising a native oxide formed by the method of exposing at least part of the surface of said second confining layer to a water-containing environment and a temperature of at least about 375° C. for a time sufficient to convert at least a portion of said second confining layer to said native oxide, the thickness of said native oxide layer being substantially the same as or less than the thickness of that portion of said second confining layer thus converted;
   reflective facets at opposing edges of said active region; and
   means for applying an electric potential across said first and second confining layers.

2. The semiconductor laser of claim 1 wherein said substrate layer comprises an aluminum-free Group III-V semiconductor material, said first confining layer comprises a second aluminum-bearing Group III-V semiconductor material, said active region comprises at least two waveguide layers of a third aluminum-bearing Group III-V semiconductor material and a quantum well heterostructure disposed between said waveguide layers said quantum well heterostructure comprising a fourth aluminum-bearing Group III-V semiconductor material.

3. The semiconductor laser of claim 1 further comprising a contact layer disposed intermittently on the surface of said second confining layer at areas of said second confining layer not converted to said native oxide.

4. The semiconductor laser of claim 3 wherein said contact layer is intermittently disposed in a single stripe configuration.

5. The semiconductor laser of claim 3 wherein said contact layer is intermittently disposed in a multiple stripe configuration.

6. A semiconductor light emitting device, comprising:
   a semiconductor active region disposed between first and second confining regions of semiconductor material;
   an insulating region adjacent said second confining region, said insulating region comprising a native oxide formed from an aluminum-bearing III-V semiconductor material by exposing said aluminum-bearing III-V semiconductor material to a water containing environment and a temperature of at least about 375° C. to convert at least a portion of said III-V semiconductor material to said native oxide; and
   means for applying electric potential across said upper and lower confining regions.

7. The semiconductor light-emitting device as defined by claim 6, wherein said first and second confining regions are of opposite semiconductor types.

8. The semiconductor light emitting device as defined by claim 6, wherein said aluminum-bearing III-V material is aluminum gallium arsenide.

9. The semiconductor light emitting device as defined by claim 7, wherein said aluminum-bearing III-V material is aluminum gallium arsenide.

10. A semiconductor laser device, comprising:
    a semiconductor active region disposed between first and second confining regions of semiconductor material;
    an insulating region adjacent said second confining region, said insulating region comprising a native oxide formed from an aluminum-bearing III-V semiconductor material by exposing said aluminum-bearing III-V semiconductor material to a water containing environment and a temperature of at least about 375° C. to convert at least a portion of said III-V semiconductor material to said native oxide; and
    reflective facets at opposing edges of said active region;
    means for applying electric potential across said upper and lower confining regions.

11. The semiconductor light-emitting device as defined by claim 10, wherein said first and second confining regions are of opposite semiconductor types.

12. The semiconductor light emitting device as defined by claim 10, wherein said aluminum-bearing III-V material is aluminum gallium arsenide.

13. The semiconductor light emitting device as defined by claim 11, wherein said aluminum-bearing III-V material is aluminum gallium arsenide.

* * * * *